US009142792B2

(12) United States Patent
Watanabe et al.

(10) Patent No.: US 9,142,792 B2
(45) Date of Patent: Sep. 22, 2015

(54) ORGANIC ELECTRONIC DEVICES COMPRISING A LAYER COMPRISING AT LEAST ONE METAL ORGANIC COMPOUND AND AT LEAST ONE METAL OXIDE

(75) Inventors: Soichi Watanabe, Mannheim (DE); Christian Schildknecht, Mannheim (DE); Gerhard Wagenblast, Wachenheim (DE); Christian Lennartz, Schifferstadt (DE); Evelyn Fuchs, Mannheim (DE); Oliver Molt, Weinheim (DE); Thomas Gessner, Heidelberg (DE); Korinna Dormann, Bad Duerkheim (DE); Nicolle Langer, Heppenheim (DE); Junichi Tanabe, Mannheim (DE)

(73) Assignee: BASF SE, Ludwigshafen (DE)

( * ) Notice: Subject to any disclaimer, the term of this patent is extended or adjusted under 35 U.S.C. 154(b) by 947 days.

(21) Appl. No.: 13/162,244

(22) Filed: Jun. 16, 2011

(65) Prior Publication Data

US 2011/0309346 A1    Dec. 22, 2011

Related U.S. Application Data

(60) Provisional application No. 61/356,080, filed on Jun. 18, 2010.

(51) Int. Cl.
*H01L 51/54* (2006.01)
*H01L 51/50* (2006.01)
*H01L 51/00* (2006.01)

(52) U.S. Cl.
CPC ........... *H01L 51/506* (2013.01); *H01L 51/0072* (2013.01); *H01L 51/0073* (2013.01); *H01L 51/0077* (2013.01); *H01L 51/0085* (2013.01); *H01L 51/0094* (2013.01)

(58) Field of Classification Search
CPC .............. H01L 51/5052; H01L 51/206; H01L 51/5088; H01L 51/0084; H01L 51/0085; H01L 51/0086; H01L 51/0087; H01L 51/0088; H01L 51/50; H01L 51/5048; H01L 51/5056; H01L 51/0051
See application file for complete search history.

(56) References Cited

U.S. PATENT DOCUMENTS

| | | |
|---|---|---|
| 2001/0015432 A1 | 8/2001 | Igarashi |
| 2001/0019782 A1 | 9/2001 | Igarashi et al. |
| 2002/0024293 A1 | 2/2002 | Igarashi et al. |
| 2002/0048689 A1 | 4/2002 | Igarashi et al. |
| 2002/0055014 A1 | 5/2002 | Okada et al. |
| 2002/0094453 A1 | 7/2002 | Takiguchi et al. |
| 2006/0008740 A1 | 1/2006 | Kido et al. |
| 2006/0180812 A1 | 8/2006 | Sakata et al. |
| 2006/0258043 A1 | 11/2006 | Bold et al. |
| 2007/0172699 A1* | 7/2007 | Nakashima et al. ........... 428/690 |
| 2007/0200125 A1* | 8/2007 | Ikeda et al. ..................... 257/94 |
| 2007/0224446 A1 | 9/2007 | Nakano et al. |
| 2008/0008905 A1 | 1/2008 | Yamazaki |
| 2008/0018221 A1 | 1/2008 | Egen et al. |
| 2008/0106188 A1* | 5/2008 | Hwang et al. ................. 313/504 |
| 2009/0017331 A1 | 1/2009 | Iwakuma et al. |
| 2009/0026938 A1 | 1/2009 | Okada et al. |
| 2009/0054657 A1 | 2/2009 | Molt et al. |
| 2009/0066226 A1 | 3/2009 | Sugita et al. |
| 2009/0079329 A1 | 3/2009 | Murakami et al. |
| 2009/0096367 A1 | 4/2009 | Fuchs et al. |
| 2009/0131673 A1* | 5/2009 | Tanabe et al. ................... 546/88 |
| 2009/0134784 A1 | 5/2009 | Lin et al. |
| 2009/0153034 A1 | 6/2009 | Lin et al. |
| 2009/0206743 A1 | 8/2009 | Oda et al. |
| 2009/0278119 A1* | 11/2009 | Schildknecht et al. ......... 257/40 |
| 2009/0284138 A1 | 11/2009 | Yasukawa et al. |
| 2010/0301312 A1* | 12/2010 | Jinde et al. ...................... 257/40 |
| 2011/0031477 A1 | 2/2011 | Langer et al. |
| 2011/0034699 A1 | 2/2011 | Fuchs et al. |

FOREIGN PATENT DOCUMENTS

| | | |
|---|---|---|
| CN | 101510585 A | 8/2009 |
| DE | 10 2008 051 132 A1 | 1/2010 |
| EP | 1 191 612 A2 | 3/2002 |
| EP | 1 191 613 A2 | 3/2002 |
| EP | 1 211 257 A2 | 6/2002 |
| EP | 1 970 976 A1 | 9/2008 |
| EP | 1 998 388 A1 | 12/2008 |
| EP | 2 034 538 A1 | 3/2009 |
| EP | 1 885 818 B1 | 1/2010 |
| JP | 2006-321750 | 11/2006 |
| JP | 2008-21687 | 1/2008 |
| JP | 2008-66569 | 3/2008 |
| JP | 2008-74939 | 4/2008 |

(Continued)

OTHER PUBLICATIONS

English language machine translation of JP 2008/127326 A, 2008.*
U.S. Appl. No. 14/115,934, filed Nov. 6, 2013, Wagenblast, et al.
U.S. Appl. No. 14/123,530, filed Dec. 3, 2013, Koenemann, et al.
U.S. Appl. No. 13/418,989, filed Mar. 13, 2012, Koenemann, et al.
M. A. Baldo, et al., "Very high-efficiency green organic light-emitting devices based on electrophosphorescence", Applied Physics Letters, vol. 75, No. 1, Jul. 5, 1999, 3 pages.

(Continued)

*Primary Examiner* — Michael H Wilson
(74) *Attorney, Agent, or Firm* — Oblon, McClelland, Maier & Neustadt, L.L.P.

(57) ABSTRACT

The present invention relates to an organic electronic device including a first electrode, a second electrode and a first organic layer interposed between the first electrode and the second electrode, wherein the first organic layer comprises at least one metal organic compound and at least one metal oxide. The present invention further relates to an apparatus comprising the organic electronic device according to the present invention.

13 Claims, No Drawings

(56) References Cited

FOREIGN PATENT DOCUMENTS

| | | |
|---|---|---|
| JP | 2008-84913 | 4/2008 |
| JP | 2008-127326 | 6/2008 |
| JP | 2008-207520 | 9/2008 |
| JP | 2009-21336 | 1/2009 |
| JP | 2009-59767 | 3/2009 |
| JP | 2009-114369 | 5/2009 |
| JP | 2009-114370 | 5/2009 |
| JP | 2009-135183 | 6/2009 |
| JP | 2009-170764 | 7/2009 |
| JP | 2009-182298 | 8/2009 |
| JP | 2009-267255 | 11/2009 |
| JP | 2010-21336 | 1/2010 |
| JP | 2010-40830 | 2/2010 |
| JP | 2010-114180 | 5/2010 |
| JP | 2010-135467 | 6/2010 |
| WO | WO 00/32717 | 6/2000 |
| WO | WO 00/70655 | 11/2000 |
| WO | WO 01/41512 A1 | 6/2001 |
| WO | WO 02/02714 A2 | 1/2002 |
| WO | WO 02/15645 A1 | 2/2002 |
| WO | WO 02/060910 A1 | 8/2002 |
| WO | WO 2005/019373 A2 | 3/2005 |
| WO | WO 2005/113704 A2 | 12/2005 |
| WO | WO 2006/056418 A2 | 6/2006 |
| WO | WO 2006/067074 A1 | 6/2006 |
| WO | WO 2006/100298 A1 | 9/2006 |
| WO | WO 2006/115301 A1 | 11/2006 |
| WO | WO 2006/121811 A1 | 11/2006 |
| WO | WO 2006/128800 A1 | 12/2006 |
| WO | WO 2007/077810 A1 | 7/2007 |
| WO | WO 2007/095118 A2 | 8/2007 |
| WO | WO 2007/108362 A1 | 9/2007 |
| WO | WO 2007/108459 A1 | 9/2007 |
| WO | WO 2007/114244 A1 | 10/2007 |
| WO | WO 2007/115970 A1 | 10/2007 |
| WO | WO 2007/115981 A1 | 10/2007 |
| WO | WO 2007/119816 A1 | 10/2007 |
| WO | WO 2008/000727 A1 | 1/2008 |
| WO | WO 2008/029652 A1 | 3/2008 |
| WO | WO 2008/029729 A1 | 3/2008 |
| WO | WO 2008/034758 A2 | 3/2008 |
| WO | WO 2008/035571 A1 | 3/2008 |
| WO | WO 2008/072596 A1 | 6/2008 |
| WO | WO 2008/090912 A1 | 7/2008 |
| WO | WO 2008/140114 A1 | 11/2008 |
| WO | WO 2008/146838 A1 | 12/2008 |
| WO | WO 2008/156105 A1 | 12/2008 |
| WO | WO 2009/003898 A1 | 1/2009 |
| WO | WO 2009/003919 A1 | 1/2009 |
| WO | WO 2009/008099 A1 | 1/2009 |
| WO | WO 2009/008100 A1 | 1/2009 |
| WO | WO 2009/060742 A1 | 5/2009 |
| WO | WO 2009/060757 A1 | 5/2009 |
| WO | WO 2009/060779 A1 | 5/2009 |
| WO | WO 2009/060780 A1 | 5/2009 |
| WO | WO 2009/063757 A1 | 5/2009 |
| WO | WO 2009/069442 A1 | 6/2009 |
| WO | WO 2009/081857 A1 * | 7/2009 ............ H01L 51/50 |
| WO | WO 2009/084413 A1 | 7/2009 |
| WO | WO 2009/086028 A2 | 7/2009 |
| WO | WO 2009/104488 A1 | 8/2009 |
| WO | WO 2010/001830 A1 | 1/2010 |
| WO | WO 2010/004877 A1 | 1/2010 |
| WO | WO 2010/040777 A1 | 4/2010 |
| WO | WO 2010/044342 A1 | 4/2010 |
| WO | WO 2010/067746 A1 | 6/2010 |
| WO | WO 2010/079051 A1 | 7/2010 |
| WO | WO 2010/079678 A1 | 7/2010 |
| WO | WO 2010/087222 A1 | 8/2010 |
| WO | WO 2010/090077 A1 | 8/2010 |
| WO | WO 2010/095564 A1 | 8/2010 |
| WO | 2011/157779 A1 | 12/2011 |
| WO | 2011/157790 A1 | 12/2011 |

OTHER PUBLICATIONS

Hisahiro Sasabe, et al., "2-Phenylpyrimidine skeleton-based electron-transport materials for extremely efficient green organic light-emitting devices", Chem. Commun., 2008, pp. 5821-5823.
Hisahiro Sasabe, et al., "Wide-Energy-Gap Electron-Transport Materials Containing 3,5-Dipyridylphenyl Moieties for an Ultra High Efficiency Blue Organic Light-Emitting Device", Chem. Mater., vol. 20, No. 19, 2008, pp. 5951-5953.
Christoph Schmitz, et al., "Lithium-Quinolate Complexes as Emitter and Interface Materials in Organic Light-Emitting Diodes", Chem. Mater. vol. 12, No. 10, 2000, pp. 3012-3019.
International Search Report and Written Opinion issued Nov. 10, 2011 in Application No. PCT/IB2011/052625.
U.S. Appl. No. 61/356,057, filed Jun. 18, 2010, Schildknecht, et al.
U.S. Appl. No. 13/159,957, filed Jun. 18, 2010, Schildknecht, et al.
U.S. Appl. No. 61/356,058, filed Jun. 18, 2010, Schildknecht, et al.
U.S. Appl. No. 13/160,052, filed Jun. 18, 2010, Schildknecht, et al.
U.S. Appl. No. 14/238,382, filed Feb. 11, 2014, Suraru, et al.
J.W. Ma, et al., "Organic light-emitting diodes based on new n-doped electron transport layer", Synthetic Metals, vol. 158, Issues 21-24, 2008, pp. 810-814.

* cited by examiner

ORGANIC ELECTRONIC DEVICES COMPRISING A LAYER COMPRISING AT LEAST ONE METAL ORGANIC COMPOUND AND AT LEAST ONE METAL OXIDE

The present invention relates to an organic electronic device including a first electrode, a second electrode and a first organic layer interposed between the first electrode and the second electrode, wherein the first organic layer comprises at least one metal organic compound and at least one metal oxide. The present invention further relates to an apparatus comprising the organic electronic device according to the present invention.

Organic electronics is a subfield of electronics and uses electronic circuits which comprise polymers or smaller organic compounds. Fields of use of organic electronics are the use of polymers or smaller organic compounds in organic light-emitting diodes (OLEDs), use in organic solar cells (organic photovoltaics) and in switching elements such as organic transistors, for example organic FETs and organic TFTs.

The use of suitable novel organic materials thus allows various new types of components based on organic electronics to be provided, such as displays, sensors, transistors, data stores or photovoltaic cells. This makes possible the development of new applications which are thin, light, flexible and producible at low cost.

A preferred field of use according to the present application is the use of relatively small organic compounds in organic light-emitting diodes.

Organic light-emitting diodes (OLEDs) exploit the property of materials of emitting light when they are excited by electrical current. OLEDs are of particular interest as an alternative to cathode ray tubes and liquid-crystal displays for producing flat visual display units. Owing to the very compact design and the intrinsically low power consumption, the devices comprising OLEDs are suitable especially for mobile applications, for example for applications in cellphones, laptops, etc., and for illumination.

The basic principles of the way in which OLEDs work and suitable structures (layers) of OLEDs are specified, for example, in WO 2005/113704 and the literature cited therein.

The light-emitting materials (emitters) used may, as well as fluorescent materials (fluorescence emitters), be phosphorescent materials (phosphorescence emitters). The phosphorescence emitters are typically organometallic complexes which, in contrast to the fluorescence emitters which exhibit singlet emission, exhibit triplet emission (M. A. Baldow et al., Appl. Phys. Lett. 1999, 75, 4 to 6). For quantum-mechanical reasons, when the phosphorescence emitters are used, up to four times the quantum efficiency, energy efficiency and power efficiency is possible.

Of particular interest are organic light-emitting diodes with long operative lifetime, good efficiency, high stability to thermal stress and a low use and operating voltage.

In order to implement the aforementioned properties in practice, it is not only necessary to provide suitable emitter materials, but the other components of the OLED (complementary materials) must also be balanced to one another in suitable device compositions. Such device compositions may, for example, comprise specific matrix materials in which the actual light emitter is present in distributed form. In addition, the compositions may comprise blocker materials, it being possible for hole blockers, exciton blockers and/or electron blockers to be present in the device compositions. Additionally or alternatively, the device compositions may further comprise hole injection materials and/or electron injection materials and/or charge transport materials such as hole transport materials and/or electron transport materials. The selection of the aforementioned materials which are used in combination with the actual light emitter has a significant influence on parameters including the efficiency and the lifetime, and the use and operating voltages, of the OLEDs.

Especially, demands for reduction in power consumption of apparatuses comprising organic electronic devices, especially organic light-emitting diodes (OLEDs), have been increased. In order to reduce the power consumption, it has been attempted to reduce the driving voltage of an organic electronic device. It is further important to prolong lifetime of an organic electronic device, especially an OLED, in addition to the reduction in driving voltage. In the prior art, light emitting elements have been developed to overcome the above problems.

US 2006/0180812 A1 discloses a light emitting element having a layer containing an organic material and an inorganic material, wherein activation energy of electrical conductivity of said layer is 0.01 eV or more and less than 0.30 eV. Suitable organic materials are organic compounds comprising an arylamine skeleton and having hole transporting properties, e.g. 4,4'-bis(N-{4-[N,N'-bis(3-methylphenyl)amino]phenyl}-N-phenylamino)biphenyl (DNTPD) and N,N'-bis(spiro-9,9'-bifluorene-2-yl)-N,N'-diphenylbenzidine (BSPB). Suitable inorganic materials are metal oxides, especially molybdenum oxide, vanadium oxide, ruthenium oxide, and tungsten oxide. It is mentioned in US 2006/0180812 A1 that the more the concentration of molybdenum oxide increases, the more the resistance is reduced, whereas when the concentration of molybdenum oxide is more than 80 wt %, the more the resistance increases.

US 2008/0008905 A1 discloses an electrode of a pixel or a pixel portion with a light transmitting conductive film containing a hole-transporting organic compound and a metal oxide which shows an electron accepting property with respect to the hole-transporting organic compound. The organic compounds are aromatic amine compounds, carbazole derivatives, aromatic hydrocarbons and high molecular compounds. The inorganic compounds are transition metal oxides, whereby molybdenum oxide is particularly preferred.

DE 10 2008 051 132 A1 discloses an organic electronic device having a specific layer sequence. The device comprises a charge transport layer comprising a matrix material comprising a dopant, wherein the matrix material and the dopant form a charge transfer complex. In DE 10 2008 051 132 A1 suitable matrix materials for a hole transport layer are mentioned. All materials mentioned are organic materials, especially aromatic amino compounds. Suitable dopants are for example metal oxides.

US 2006/0008740 A1 discloses an organic device, including an organic compound having charge transporting ability. The device comprising a charge transfer complex-contained layer having a charge transfer complex formed upon contact of an organic hole transporting compound and a molybdenum trioxide via a manner of lamination or mixing; wherein the organic hole transporting compound is in a state of radical cations in the charge transfer complex-contained layer. Suitable organic hole-transporting compounds are arylamine compounds.

In the prior art mentioned above, reduction of power consumption is achieved by using a hole transport layer comprising an organic compound, especially an arylamine compound, and a metal oxide, especially (in most cases) molybdenum oxide.

However, there is room for further improvement in the reduction of power consumption as well as in the prolongation of lifetime of organic electronic devices.

It is therefore an object of the present invention to provide organic electronic devices, especially organic light-emitting diodes (OLEDs), showing low operating voltage, good operative lifetimes as well as good efficiencies and a high stability to thermal stress.

The object is solved by an organic electronic device including a first electrode, a second electrode and a first organic layer interposed between the first electrode and the second electrode, wherein the first organic layer comprises at least one metal organic compound and at least one metal oxide.

Organic electronic devices of the present invention having a first organic layer comprising at least one metal organic compound and at least one metal oxide show superior power efficiency, lifetime, quantum efficiency and/or a low operating voltage.

Metal Oxide

The first organic layer comprises at least one metal oxide, preferably one or two metal oxides, more preferably one metal oxide.

The metal oxide is preferably a transition metal oxide, more preferably an oxide of a metal belonging to Groups 4, 5, 6, 7 or 8 of the periodic table. Even more preferably, the metal oxide is selected from rhenium oxide, molybdenum oxide, vanadium oxide, tungsten oxide, niobium oxide, tantalum oxide, chromium oxide and manganese oxide. The metal may be present in said oxides in every suitable oxidation state. Most preferably, the metal oxide is molybdenum oxide ($MoO_x$) or rhenium oxide ($ReO_x$), especially $MoO_3$ or $ReO_3$. Above all, $ReO_3$ is particularly preferably. It has been found by the inventors that by using $ReO_3$ electronic devices having superior operative lifetimes are obtained.

The metal oxide is employed in the first organic layer usually in an amount of from 0.1 to <10 wt %, preferably 1 to 8 wt %, more preferably 3 to 5 wt % based on the total amount of the first organic layer (which is 100 wt %). It has been found by the inventors that there is an optimum amount of metal oxides. If more than the optimum amount is used, the operative lifetime of the electronic device is high but clearly reduced compared with the optimum amount.

Metal Organic Compound

The first organic layer comprises at least one metal organic compound, preferably one or two metal organic compounds, more preferably one metal organic compound.

The term "metal organic compound" (or organometallic compound) is generally understood by one of ordinary skill. According to the present invention, the term is understood as defined in Inorganic Chemistry (2nd edition) by Gary L. Miesler and Donald A. Tarr, Prentice-Hall (1998), page 422, chapter 13, first paragraph.

Preferred metal organic compounds are metal organic compounds having hole transporting properties. In the case of OLEDs is the band gap of the at least one metal organic compound with hole transporting property generally greater than the band gap of the emitter material used. In the context of the present application, "band gap" is understood to mean the triplet energy.

Particularly preferred metal organic compounds are carbene complexes. Suitable carbene complexes are, for example, carbene complexes as described in WO 2005/019373, WO 2006/056418, WO 2005/113704, WO 2007/115970, WO 2007/115981 and WO 2008/000727.

Examples for particularly preferred carbene complexes are compound of the following formula (I)

wherein the symbols have the following meanings:

$M^1$ is a metal atom selected from the group consisting of Co, Rh, Ir, Nb, Pd, Pt, Fe, Ru, Os, Cr, Mo, W, Mn, Tc, Re, Cu, Ag and Au in any oxidation state possible for the respective metal atom;

Carbene is a carbene ligand which may be uncharged or monoanionic and monodentate, bidentate or tridentate, with the carbene ligand also being able to be a biscarbene or triscarbene ligand;

L is a monoanionic or dianionic ligand, which may be monodentate or bidentate;

K is an uncharged monodentate or bidentate ligand selected from the group consisting of phosphines; phosphonates and derivatives thereof, arsenates and derivatives thereof; phosphites; CO; pyridines; nitriles and conjugated dienes which form a π complex with $M^1$;

n is the number of carbene ligands, where n is at least 1 and when n>1 the carbene ligands in the complex of the formula I can be identical or different;

m is the number of ligands L, where m can be 0 or ≥1 and when m>1 the ligands L can be identical or different;

o is the number of ligands K, where o can be 0 or ≥1 and when o>1 the ligands K can be identical or different;

where the sum n+m+o is dependent on the oxidation state and coordination number of the metal atom and on the denticity of the ligands carbene, L and K and also on the charge on the ligands, carbene and L, with the proviso that n is at least 1.

Said carbene complexes are described in WO 2005/19373.

One example of a suitable carbene complex is fac-iridium-tris(1,3-diphenylbenzimidazoline-2-ylidene-C,C2') (Ir(dp-bic)$_3$) having the formula (Ia)

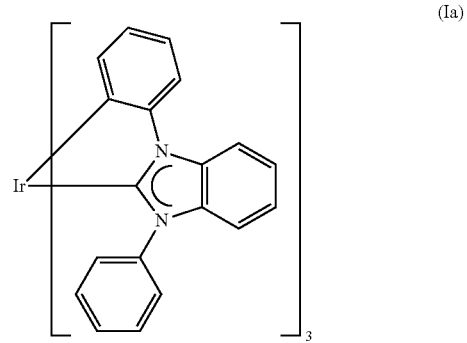

which is disclosed in WO 2005/19373.

The at least one metal organic compound, preferably the carbene complex, is employed in the first organic layer usually in an amount of from >90 to 99.9 wt %, preferably 92 to 99 wt %, more preferably 95 to 97 wt % based on the total amount of the first organic layer (which is 100 wt %).

First Organic Layer

The first organic layer comprises at least one metal organic compound and at least one metal oxide. Preferred metal organic compounds and preferred metal oxides and suitable amounts of metal organic compounds and metal oxides are mentioned before.

The first organic layer is preferably a hole transport layer or a hole injection layer, more preferably a hole transport layer.

The first organic layer preferably comprises:
i) from 0.1 to <10 wt %, preferably 1 to 8 wt %, more preferably 3 to 5 wt % of a metal oxide, preferably a metal oxide selected from rhenium oxide, molybdenum oxide, vanadium oxide, tungsten oxide, niobium oxide, tantalum oxide, chromium oxide and manganese oxide in every suitable oxidation state, more preferably, molybdenum oxide ($MoO_x$) or rhenium oxide ($ReO_x$), especially $MoO_3$ or $ReO_3$, most preferably $ReO_3$; and
ii) from >90 to 99.9 wt %, preferably 92 to 99 wt %, more preferably 95 to 97 wt % of a metal organic compound, preferably of a carbene complex, more preferably of a carbene complex of formula (I), most preferably of a carbene complex of formula (Ia), wherein the total amount of the metal oxide and the metal organic compound is 100 wt %.

In a more preferred embodiment the first organic layer comprises:
i) from 0.1 to <10 wt %, preferably 1 to 8 wt %, more preferably 3 to 5 wt % of $ReO_3$; and
ii) from >90 to 99.9 wt %, preferably 92 to 99 wt %, more preferably 95 to 97 wt % of a carbene complex, preferably of a carbene complex of formula (I), more preferably of a carbene complex of formula (Ia), wherein the total amount of the metal oxide and the carbene complex is 100 wt %.

The first organic layer is prepared by any method, for example by a wet method or a dry method. The first organic layer can for example be prepared by co-evaporation of the above mentioned metal organic compound and metal oxide. Since especially $ReO_3$ is easily vaporized in vacuum, the co-evaporation method mentioned before is a preferred method. However, it is also possible to prepare the first organic layer in such a way that a solution including the above mentioned metal organic compound and metal alkoxide is coated and baked. As a coating method, for example an ink-jet method or a spin coating method can be used. The further organic layers of the electronic device of the present invention mentioned below can be prepared in the same way as the first organic layer.

The first organic layer has usually a thickness of from 5 to 100 nm, preferably 20 to 80 nm.

In a further embodiment, the present invention relates to an organic layer, preferably a hole transport layer or a hole injection layer, comprising at least one metal organic compound and at least one metal oxide. Suitable metal organic compounds and metal oxides as well as suitable amounts are mentioned before. Preferably, the hole transport layer or the hole injection layer is a hole transport layer or hole injection layer in an organic light-emitting diode (OLED).

In one embodiment of the present invention, the organic electronic device additionally comprises a second organic layer comprising at least one compound of formula (II)

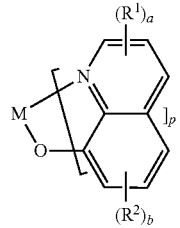

wherein
$R^1$ and $R^2$ are independently of each other F, $C_1$-$C_8$alkyl, or $C_6$-$C_{14}$aryl, which may optionally be substituted by one, or more $C_1$-$C_8$alkyl groups, or two substituents $R^1$ and/or $R^2$ combine to form a fused benzene ring group, which may optionally be substituted by one, or more $C_1$-$C_8$alkyl groups,
a and b are independently of each other 0, or an integer 1 to 3,
M is an alkali metal atom, or an earth alkaline metal atom,
p is 1, if M is an alkali metal atom, p is 2, if M is an earth alkaline metal atom.

The most preferred metal complex is

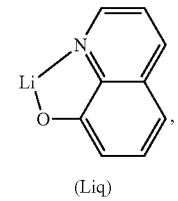

(Liq)

which can exist as the single species, or in other forms such as $Li_gQ_g$, where g is an integer, for example $Li_6Q_6$. Q represents 8-hydroxyquinolate ligand or a derivative of 8-hydroxyquinolate.

Preferably, the second organic layer additionally comprises at least one compound of formula (III), (IVa) and/or (IVb)

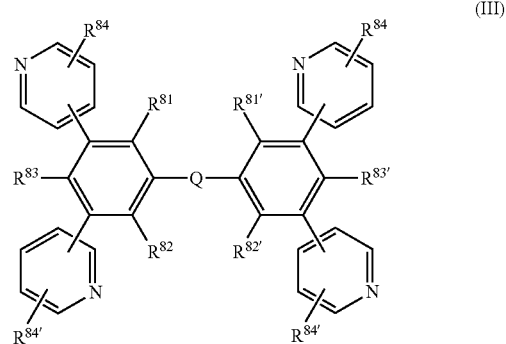

(III)

wherein
$R^{81}, R^{82}, R^{83}, R^{84}, R^{81'}, R^{82'}, R^{83'}$, and $R^{84'}$ are independently of each other H, $C_1$-$C_{18}$alkyl, $C_1$-$C_{18}$alkyl which is substituted by E and/or interrupted by D, $C_6$-$C_{24}$aryl, $C_6$-$C_{24}$aryl which is substituted by G, $C_2$-$C_{20}$heteroaryl, or $C_2$-$C_{20}$heteroaryl which is substituted by G,
Q is an arylene or heteroarylene group, each of which may optionally be substituted by G;
D is —CO—; —COO—; —S—; —SO—; —SO$_2$—; —O—; —NR$^{25}$—; —SiR$^{30}$R$^{31}$—; —POR$^{32}$—; —CR$^{23}$=CR$^{24}$—; or —C≡C—; and
E is —OR$^{29}$; —SR$^{29}$; —NR$^{25}$R$^{26}$; —COR$^{28}$; —COOR$^{27}$; —CONR$^{25}$R$^{26}$; —CN; or F; G is E, $C_1$-$C_{18}$alkyl, $C_1$-$C_{18}$alkyl which is interrupted by D, $C_1$-$C_{18}$ perfluoroalkyl, $C_1$-$C_{18}$alkoxy, or $C_1$-$C_{18}$alkoxy which is substituted by E and/or interrupted by D, wherein
$R^{23}$ and $R^{24}$ are independently of each other H, $C_6$-$C_{18}$aryl; $C_6$-$C_{18}$aryl which is substituted by $C_1$-$C_{18}$alkyl, or $C_1$-$C_{18}$alkoxy; $C_1$-$C_{18}$alkyl; or $C_1$-$C_{18}$alkyl which is interrupted by —O—;
$R^{25}$ and $R^{26}$ are independently of each other $C_6$-$C_{18}$aryl; $C_6$-$C_{18}$aryl which is substituted by $C_1$-$C_{18}$alkyl, or $C_1$-$C_{18}$alkoxy; $C_1$-$C_{18}$alkyl; or $C_1$-$C_{18}$alkyl which is interrupted by —O—; or
$R^{25}$ and $R^{26}$ together form a five or six membered ring, $R^{27}$ and $R^{28}$ are independently of each other $C_6$-$C_{18}$aryl; $C_6$-$C_{18}$aryl which is substituted by $C_1$-$C_{18}$alkyl, or $C_1$-$C_{18}$alkoxy; $C_1$-$C_{18}$alkyl; or $C_1$-$C_{18}$alkyl which is interrupted by —O—, $R^{29}$ is $C_6$-$C_{18}$aryl; $C_6$-$C_{18}$aryl, which is substituted by $C_1$-$C_{18}$alkyl, or $C_1$-$C_{18}$alkoxy; $C_1$-$C_{18}$alkyl; or $C_1$-$C_{18}$alkyl which is interrupted by —O—, $R^{30}$ and $R^{31}$ are independently of each other $C_1$-$C_{18}$alkyl, $C_6$-$C_{18}$aryl, or $C_6$-$C_{18}$aryl, which is substituted by $C_1$-$C_{18}$alkyl, $R^{32}$ is $C_1$-$C_{18}$alkyl, $C_6$-$C_{18}$aryl, or $C_6$-$C_{18}$aryl, which is substituted by $C_1$-$C_{18}$alkyl.

Preferred compounds of formula (III) are compounds of formula (IIIa)

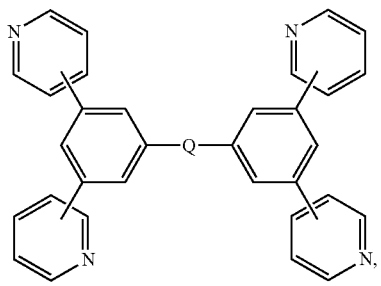

(IIIa)

wherein Q is

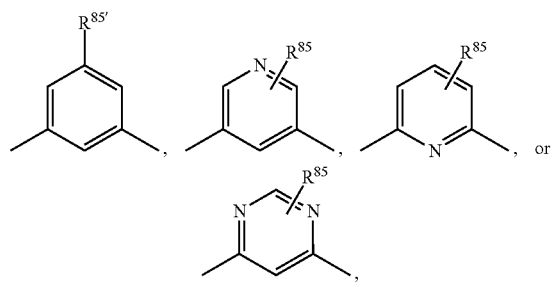

$R^{85}$ is H, or $C_1$-$C_{18}$alkyl and

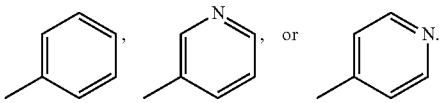

$R^{85'}$ is H, $C_1$-$C_{18}$alkyl, or

Most preferred is a compound of formula (IIIaa)

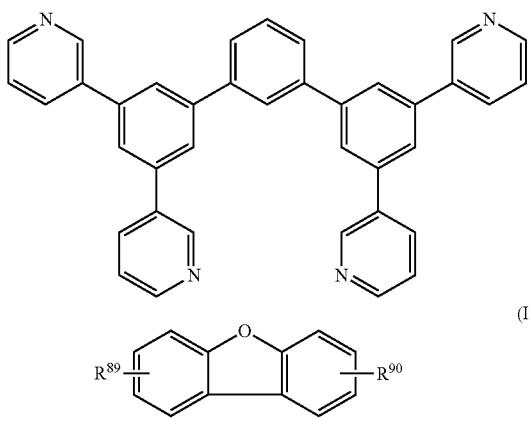

(IIIaa)

(IVa)

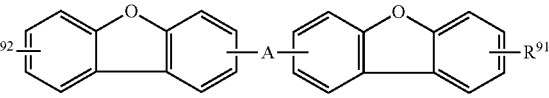

(IVb)

wherein $R^{89}$ is phenanthryl, pyrenyl, triphenylenyl, 1,10-phenanthrolinyl, triazinyl, dibenzothiophenyl, or pyrimidinyl, each of which may optionally be substituted by one, or more $C_1$-$C_{18}$alkyl, $C_6$-$C_{14}$aryl, or $C_2$-$C_{20}$heteroaryl groups, $R^{90}$ is phenanthryl, pyrenyl, triphenylenyl, 1,10-phenanthrolinyl, triazinyl, dibenzothiophenyl, or pyrimidinyl, each of which may optionally be substituted by one, or more $C_1$-$C_{18}$alkyl, $C_6$-$C_{14}$aryl, or $C_2$-$C_{20}$heteroaryl groups, $R^{91}$ is phenanthryl, pyrenyl, triphenylenyl, 1,10-phenanthrolinyl, triazinyl, dibenzothiophenyl, pyrimidinyl, or dibenzofuranyl, each of which may optionally be substituted by one, or more $C_1$-$C_{18}$alkyl, $C_6$-$C_{14}$aryl, or $C_2$-$C_{20}$heteroaryl groups, $R^{92}$ is H, phenanthryl, pyrenyl, triphenylenyl, 1,10-phenanthrolinyl, triazinyl, dibenzothiophenyl, or pyrimidinyl, each of which may optionally be substituted by one, or more $C_1$-$C_{18}$alkyl, $C_6$-$C_{14}$aryl, or $C_2$-$C_{20}$heteroaryl groups, A is a single bond, arylene, or heteroarylene group, each of which may optionally be substituted by one, or more $C_1$-$C_{18}$alkyl groups; or —$SiR^{87}R^{88}$—, wherein $R^{87}$ and $R^{88}$ are independently of each other $C_1$-$C_{18}$alkyl, or $C_6$-$C_{14}$aryl groups, which may optionally be substituted by one, or more $C_1$-$C_{18}$alkyl groups.

Preferred compounds of formula (IVa) and (IVb) are:

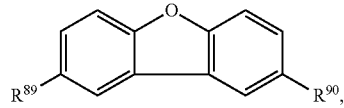

(IVaa)

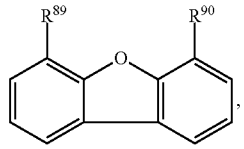

(IVab)

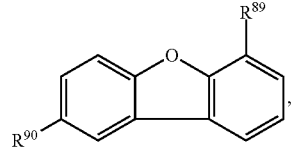

(IVac)

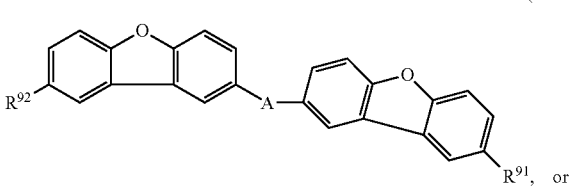

(IVba)

or

-continued

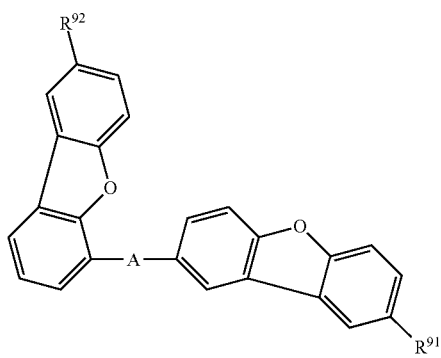
(IVbb)

wherein A, $R^{89}$, $R^{90}$, $R^{91}$ and $R^{92}$ are as defined above.

Most preferred is a compound of formula (IVaaa)

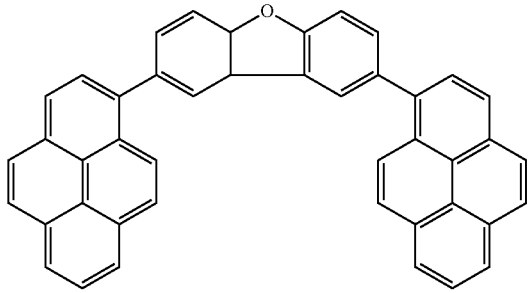
(IVaaa)

$C_1$-$C_{18}$alkyl is typically linear or branched, where possible. Examples are methyl, ethyl, n-propyl, isopropyl, n-butyl, sec.-butyl, isobutyl, tert.-butyl, n-pentyl, 2-pentyl, 3-pentyl, 2,2-dimethylpropyl, 1,1,3,3-tetramethylpentyl, n-hexyl, 1-methylhexyl, 1,1,3,3,5,5-hexamethylhexyl, n-heptyl, isoheptyl, 1,1,3,3-tetramethylbutyl, 1-methylheptyl, 3-methylheptyl, n-octyl, 1,1,3,3-tetramethylbutyl and 2-ethylhexyl, n-nonyl, decyl, undecyl, dodecyl, tridecyl, tetradecyl, pentadecyl, hexadecyl, heptadecyl, or octadecyl. $C_1$-$C_8$alkyl is typically methyl, ethyl, n-propyl, isopropyl, n-butyl, sec.-butyl, isobutyl, tert.-butyl, n-pentyl, 2-pentyl, 3-pentyl, 2,2-dimethyl-propyl, n-hexyl, n-heptyl, n-octyl, 1,1,3,3-tetramethylbutyl and 2-ethylhexyl. $C_1$-$C_4$alkyl is typically methyl, ethyl, n-propyl, isopropyl, n-butyl, sec.-butyl, isobutyl, tert.-butyl.

$C_6$-$C_{14}$aryl, which optionally can be substituted, is typically phenyl, 4-methylphenyl, 4-methoxyphenyl, naphthyl, especially 1-naphthyl, or 2-naphthyl, biphenylyl, terphenylyl, pyrenyl, 2- or 9-fluorenyl, phenanthryl, or anthryl, which may be unsubstituted or substituted.

$C_2$-$C_{20}$heteroaryl represents a ring with five to seven ring atoms or a condensed ring system, wherein nitrogen, oxygen or sulfur are the possible hetero atoms, and is typically a heterocyclic group with five to 30 atoms having at least six conjugated π-electrons such as thienyl, benzothiophenyl, dibenzothiophenyl, thianthrenyl, furyl, furfuryl, 2H-pyranyl, benzofuranyl, isobenzofuranyl, dibenzofuranyl, phenoxythienyl, pyrrolyl, imidazolyl, pyrazolyl, pyridyl, bipyridyl, triazinyl, pyrimidinyl, pyrazinyl, pyridazinyl, indolizinyl, isoindolyl, indolyl, indazolyl, purinyl, quinolizinyl, chinolyl, isochinolyl, phthalazinyl, naphthyridinyl, chinoxalinyl, chinazolinyl, cinnolinyl, pteridinyl, carbazolyl, carbolinyl, benzotriazolyl, benzoxazolyl, phenanthridinyl, acridinyl, pyrimidinyl, phenanthrolinyl, phenazinyl, isothiazolyl, phenothiazinyl, isoxazolyl, furazanyl or phenoxazinyl, which can be unsubstituted or substituted.

The $C_6$-$C_{14}$aryl and $C_2$-$C_{20}$heteroaryl groups are preferably substituted by one, or more $C_1$-$C_8$alkyl groups.

Examples of arylene radicals are phenylene, naphthylene, phenalenylene, antracylene and phenantrylene, which may optionally be substituted by one or more $C_1$-$C_{18}$alkyl groups. Preferred arylene radicals are 1,3-phenylene, 3,6-naphthylene, and 4,9-phenalenylene, which may optionally be substituted by one or more $C_1$-$C_{18}$alkyl groups.

Examples of heteroarylene radicals are 1,3,4-thiadiazol-2,5-ylene, 1,3-thiazol-2,4-ylene, 1,3-thiazol-2,5-ylene, 2,4-thiophenylene, 2,5-thiophenylene, 1,3-oxazol-2,4-ylene, 1,3-oxazol-2,5-ylene and 1,3,4-oxadiazol-2,5-ylene, 2,5-indenylene, 2,6-indenylene, especially pyrazinylene, pyridinylene, pyrimidinylene, and triazolylene, which may optionally be substituted by one or more $C_1$-$C_{18}$alkyl groups. Preferred heteroarylene radicals are 2,6-pyrazinylene, 2,6-pyridinylene, 4,6-pyrimidinylene, and 2,6-triazolylene, which may optionally be substituted by one or more $C_1$-$C_{18}$alkyl groups.

In a particularly preferred embodiment the second organic layer comprises a mixture of a compound of formula

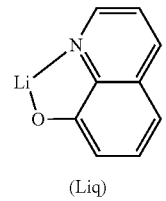
(Liq)

and a compound of formula

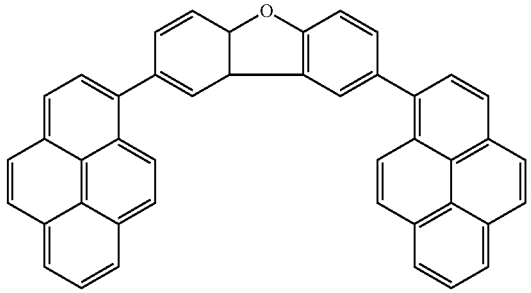

In a further particularly preferred embodiment the second organic layer comprises a mixture of a compound of formula

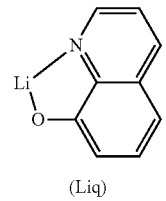
(Liq)

and a compound of formula

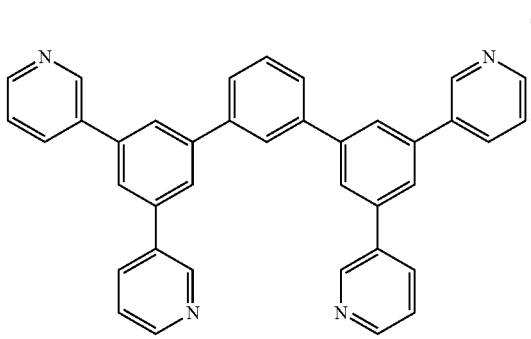
(III)

The organic metal complex of formula (II) is contained in the second organic layer in an amount of 99 to 1% weight, preferably 75 to 25% by weight, more preferably about 50% by weight, wherein the amount of compound of formula (II) and (III), or (IVa) or (IVb) sums up to 100% by weight.

The synthesis of the compounds of formula (III) is described in J. Kido et al., Chem. Commun. (2008) 5821-5823, J. Kido et al., Chem. Mater. 20 (2008) 5951-5953 and JP2008-127326, or can be done in analogy to the methods described therein.

The synthesis of the compounds of formula (VIa) and (VIb) is described in WO2006128800, or can be done in analogy to the methods described therein.

The synthesis of the compounds of formula (II) is described, for example, in Christoph Schmitz et al. Chem. Mater. 12 (2000) 3012-3019 and WO00/32717, or can be done in analogy to the methods described therein.

The second organic layer is preferably an electron transport layer.

Organic Electronic Device

The organic electronic device of the present invention includes a first electrode, a second electrode and a first organic layer interposed between the first electrode and the second electrode, wherein the first organic layer comprises at least one metal organic compound and at least one metal oxide. Preferred embodiments of the first organic layer are mentioned above.

Suitable first and second electrodes are known to those skilled in the art.

The organic electronic device of the present invention is, for example, an organic solar cell (organic photovoltaics), a switching element such as an organic transistor, for example an organic field effect transistor (FET) or an organic thin-film transistor (TFT), an organic light emitting field effect transistor (OLEFET), or an organic light-emitting diode (OLED), preference being given to OLEDs.

Suitable structures of organic electronic devices are known to those skilled in the art and are specified below.

Organic Transistor

The organic transistor generally includes a semiconductor layer formed from an organic layer with hole transport capacity and/or electron transport capacity; a gate electrode formed from a conductive layer; and an insulating layer introduced between the semiconductor layer and the conductive layer. A source electrode and a drain electrode are mounted on this arrangement in order thus to produce the transistor element. In addition, further layers known to those skilled in the art may be present in the organic transistor. In a preferred embodiment, the organic layer with hole transport capacity comprises at least one metal organic compound and at least one metal oxide. Suitable metal organic compounds and metal oxides as well as suitable amounts are mentioned before.

Organic Solar Cell

The organic solar cell (photoelectric conversion element) generally comprises an organic layer present between two plate-type electrodes arranged in parallel. The organic layer may be configured on a comb-type electrode. There is no particular restriction regarding the site of the organic layer and there is no particular restriction regarding the material of the electrodes. When, however, plate-type electrodes arranged in parallel are used, at least one electrode is preferably formed from a transparent electrode, for example an ITO electrode or a fluorine-doped tin oxide electrode. The organic layer is formed from two sublayers, i.e. a layer with p-type semiconductor properties or hole transport capacity, and a layer formed with n-type semiconductor properties or electron transport capacity. In addition, it is possible for further layers known to those skilled in the art to be present in the organic solar cell. In a preferred embodiment, the layer with hole transport capacity comprises at least one metal organic compound and at least one metal oxide. Suitable metal organic compounds and metal oxides as well as suitable amounts are mentioned before.

Organic Light-Emitting Diode (OLED)

The present invention further relates to an organic light-emitting diode comprising an anode An and a cathode Ka, a light-emitting layer E arranged between the anode An and the cathode Ka, a hole transport layer and/or a hole injection layer arranged between the light-emitting layer E and the anode An, and if appropriate at least one further layer selected from the group consisting of at least one blocking layer for holes/excitons, at least one blocking layer for electrons/excitons, at least one electron transport layer and at least one electron injection layer, wherein the hole transport layer and/or the hole injection layer comprises at least one metal organic compound and at least one metal oxide. Suitable metal organic compounds and metal oxides as well as suitable amounts are mentioned before.

Structure of the Inventive OLED

The inventive organic light-emitting diode (OLED) thus generally has the following structure:
an anode (An) and a cathode (Ka) and a light-emitting layer E arranged between the anode (An) and the cathode (Ka) and an hole transport layer and/or hole injection layer arranged between the light-emitting layer E and the anode An.

The inventive OLED may, for example—in a preferred embodiment—be formed from the following layers:

1. Anode
2. Hole transport layer
3. Light-emitting layer
4. Blocking layer for holes/excitons
5. Electron transport layer
6. Cathode Layer sequences different than the aforementioned structure are also possible, and are known to those skilled in the art. For example, it is possible that the OLED does not have all of the layers mentioned; for example, OLEDs which have layers (1), (2), (3), (4) and (6), are likewise suitable. In addition, the OLEDs may have a blocking layer for electrons/excitons between the hole transport layer (2) and the light-emitting layer (3). Further, the OLEDs may have a hole injection layer between the hole transport layer (2) and the light-emitting layer.

It is additionally possible that a plurality of the aforementioned functions (electron/exciton blocker, hole/exciton blocker, hole injection, hole transport, electron injection, electron transport) are combined in one layer and are assumed, for example, by a single material present in this layer. For example, a material used in the hole transport layer, in one embodiment, may simultaneously block excitons and/or electrons.

Furthermore, the individual layers of the OLED among those specified above may in turn be formed from two or more layers. For example, the hole transport layer may be formed from a layer into which holes are injected from the electrode, and a layer which transports the holes away from the hole-injecting layer into the light-emitting layer. The electron transport layer may likewise consist of a plurality of layers, for example a layer in which electrons are injected by the electrode, and a layer which receives electrons from the electron injection layer and transports them into the light-emitting layer. These layers mentioned are each selected according to factors such as energy level, thermal resistance and charge carrier mobility, and also energy difference of the layers specified with the organic layers or the metal electrodes. The person skilled in the art is capable of selecting the structure of the OLEDs such that it is matched optimally to the organic compounds used as emitter substances in accordance with the invention.

In order to obtain particularly efficient OLEDs, for example, the HOMO (highest occupied molecular orbital) of the hole transport layer should be matched to the work function of the anode, and the LUMO (lowest unoccupied molecular orbital) of the electron transport layer should be matched to the work function of the cathode, provided that the aforementioned layers are present in the inventive OLEDs.

The anode (1) is an electrode which provides positive charge carriers. It may be formed, for example, from materials which comprise a metal, a mixture of various metals, a metal alloy, a metal oxide or a mixture of various metal oxides. Alternatively, the anode may be a conductive polymer. Suitable metals comprise metals and alloys of the metals of the main groups, transition metals and of the lanthanoids, especially the metals of groups Ib, IVa, Va and VIa of the periodic table of the elements, and the transition metals of group VIIIa. When the anode is to be transparent, generally mixed metal oxides of groups IIb, IIIb and IVb of the periodic table of the elements (IUPAC version) are used, for example indium tin oxide (ITO). It is likewise possible that the anode (1) comprises an organic material, for example polyaniline, as described, for example, in Nature, Vol. 357, pages 477 to 479 (Jun. 11, 1992). At least either the anode or the cathode should be at least partly transparent in order to be able to emit the light formed. The material used for the anode (1) is preferably ITO.

Suitable hole transport materials for layer (2) of the inventive OLEDs—in the case that the hole transport layer does not comprise at least one metal organic compound and at least one metal oxide or in addition to the at least one metal organic compound and at least one metal oxide—are disclosed, for example, in Kirk-Othmer Encyclopedia of Chemical Technology, 4th edition, Vol. 18, pages 837 to 860, 1996. Both hole-transport molecules and polymers can be used as the hole transport material. Hole-transport molecules typically used are selected from the group consisting of tris[N-(1-naphthyl)-N-(phenylamino)]triphenylamine (1-Naph-DATA), 4,4'-bis[N-(1-naphthyl)-N-phenylamino]biphenyl (α-NPD), N,N'-diphenyl-N,N'-bis(3-methylphenyl)-[1,1'-biphenyl]-4,4'-diamine (TPD), 1,1-bis[(di-4-tolylamino)phenyl]cyclohexane (TAPC), N,N'-bis(4-methylphenyl)-N,N'-bis(4-ethylphenyl)-[1,1'-(3,3'-dimethyl)biphenyl]-4,4'-diamine (ETPD), tetrakis(3-methylphenyl)-N,N,N',N'-2,5-phenylenediamine (PDA), α-phenyl-4-N,N-diphenylaminostyrene (TPS), p-(diethylamino)benzaldehyde diphenylhydrazone (DEH), triphenylamine (TPA), bis[4-(N,N-diethylamino)-2-methylphenyl)(4-methylphenyl)methane (MPMP), 1-phenyl-3-[p-(diethylamino)styryl]-5-[p-(diethylamino)phenyl]pyrazoline (PPR or DEASP), 1,2-trans-bis(9H-carbazol-9-yl)cyclobutane (DCZB), N,N,N',N'-tetrakis(4-methylphenyl)-(1,1'-biphenyl)-4,4'-diamine (TTB), 4,4',4"-tris(N,N-diphenylamino)triphenylamine (TDTA), 4,4',4"-tris(N-carbazolyl)triphenylamine (TCTA), N,N'-bis(naphthalen-2-yl)-N,N'-bis(phenyl) benzidine (β-NPB), N,N'-bis(3-methylphenyl)-N,N'-bis(phenyl)-9,9-spirobifluorene (Spiro-TPD), N,N'-bis(naphthalen-1-yl)-N,N'-bis(phenyl)-9,9-spirobifluorene (Spiro-NPB), N,N'-bis(3-methylphenyl)-N,N'-bis(phenyl)-9,9-dimethylfluorene (DMFL-TPD), di[4-(N,N-ditolylamino)phenyl]cyclohexane, N,N'-bis(naphthalen-1-yl)-N,N'-bis(phenyl)-9,9-dimethylfluorene, N,N'-bis(naphthalen-1-yl)-N,N'-bis(phenyl)-2,2-dimethylbenzidine, N,N'-bis(naphthalen-1-yl)-N,N'-bis(phenyl)benzidine, N,N'-bis(3-methylphenyl)-N,N'-bis(phenyl)benzidine, 2,3,5,6-tetrafluoro-7,7,8,8-tetracyanoquinodimethane (F4-TCNQ), 4,4',4"-tris(N-3-methylphenyl-N-phenylamino)triphenylamine, 4,4',4"-tris(N-(2-naphthyl)-N-phenyl-amino)triphenylamine, pyrazino[2,3-f][1,10]phenanthroline-2,3-dicarbonitrile (PPDN), N,N,N',N'-tetrakis(4-methoxyphenyl) benzidine (MeO-TPD), 2,7-bis[N,N-bis(4-methoxyphenyl)amino]-9,9-spirobifluorene (MeO-Spiro-TPD), 2,2'-bis[N,N-bis(4-methoxyphenyl)amino]-9,9-spirobifluorene (2,2'-MeO-Spiro-TPD), N,N'-diphenyl-N,N'-di[4-(N,N-ditolylamino)phenyl]benzidine (NTNPB), N,N'-diphenyl-N,N'-di[4-(N,N-diphenylamino)phenyl]benzidine (NPNPB), N,N'-di(naphthalen-2-yl)-N,N'-diphenylbenzene-1,4-diamine (β-NPP), N,N'-bis(3-methylphenyl)-N,N'-bis(phenyl)-9,9-diphenylfluorene (DPFL-TPD), N,N'-bis(naphthalen-1-yl)-N,N'-bis(phenyl)-9,9-diphenylfluorene (DPFL-NPB), 2,2',7,7'-tetrakis(N,N-diphenylamino)-9,9'-spirobifluorene (Spiro-TAD), 9,9-bis[4-(N,N-bis(biphenyl-4-yl)amino)phenyl]-9H-fluorene (BPAPF), 9,9-bis[4-(N,N-bis(naphthalen-2-yl)amino)phenyl]-9H-fluorene (NPAPF), 9,9-bis[4-(N,N-bis(naphthalen-2-yl)-N,N'-bisphenylamino) phenyl]-9H-fluorene (NPBAPF), 2,2',7,7'-tetrakis[N-naphthalenyl(phenyl)amino]-9,9'-spirobifluorene (Spiro-2NPB), N,N'-bis(phenanthren-9-yl)-N,N'-bis(phenyl)benzidine (PAPB), 2,7-bis[N,N-bis(9,9-spirobifluoren-2-yl)amino]-9,9-spirobifluorene (Spiro-5), 2,2'-bis[N,N-bis(biphenyl-4-yl) amino]-9,9-spirobifluorene (2,2'-Spiro-DBP), 2,2'-bis(N,N-diphenylamino)-9.9-spirobifluorene (Spiro-BPA), 2,2',7,7'-tetra(N,N-ditolyl)amino-spirobifluorene (Spiro-TTB), N,N,N',N'-tetranaphthalen-2-ylbenzidine (TNB), porphyrin compounds and phthalocyanines such as copper phthalocyanines and titanium oxide phthalocyanines. Hole-transporting polymers typically used are selected from the group consisting of polyvinylcarbazoles, (phenylmethyl)polysilanes and polyanilines. It is likewise possible to obtain hole-transporting polymers by doping hole-transporting molecules into polymers such as polystyrene and polycarbonate. Suitable hole-transporting molecules are the molecules already mentioned above.

In addition—in one embodiment—it is possible to use carbene complexes as hole transport materials, the band gap of the at least one hole transport material generally being greater than the band gap of the emitter material used. Suitable carbene complexes are mentioned before.

In a preferred embodiment of the present invention, the hole transport layer (2) comprises at least one metal organic compound and at least one metal oxide, wherein suitable metal organic compounds and suitable metal oxides as well as suitable amounts of metal organic compounds and suitable metal oxides are mentioned above.

The light-emitting layer (3) comprises at least one emitter material. In principle, it may be a fluoroescence or phosphorescence emitter, suitable emitter materials being known to those skilled in the art. The at least one emitter material is preferably a phosphorescence emitter. The phosphorescence emitter compounds used with preference are based on metal complexes, and especially the complexes of the metals Ru, Rh, Ir, Pd and Pt, in particular the complexes of Ir, have gained significance.

Suitable metal complexes for use in the inventive OLEDs are described, for example, in documents WO 02/60910 A1, US 2001/0015432 A1, US 2001/0019782 A1, US 2002/0055014 A1, US 2002/0024293 A1, US 2002/0048689 A1, EP 1 191 612 A2, EP 1 191 613 A2, EP 1 211 257 A2, US 2002/0094453 A1, WO 02/02714 A2, WO 00/70655 A2, WO 01/41512 A1, WO 02/15645 A1, WO 2005/019373 A2, WO 2005/113704 A2, WO 2006/115301 A1, WO 2006/067074 A1, WO 2006/056418, WO 2006121811 A1, WO 2007095118 A2, WO 2007/115970, WO 2007/115981 and WO 2008/000727.

Further suitable metal complexes are the commercially available metal complexes tris(2-phenylpyridine)iridium (III), iridium(III) tris(2-(4-tolyl)pyridinato-N,C$^{2'}$), bis(2-phenylpyridine)(acetylacetonato)iridium(III), iridium(III) tris(1-phenylisoquinoline), iridium(III) bis(2,2'-benzothienyl)pyridinato-N,C$^{3'}$)(acetylacetonate), tris(2-phenylquinoline)iridium(III), iridium(III) bis(2-(4,6-difluorophenyl)pyridinato-N,C$^2$)picolinate, iridium(III) bis(1-phenylisoquinoline)(acetylacetonate), bis(2-phenylquinoline)(acetylacetonato)iridium(III), iridium(III) bis(dibenzo[f,h]quinoxaline)(acetylacetonate), iridium(III) bis(2-methyldibenzo[f,h]quinoxaline)(acetylacetonate) and tris(3-methyl-1-phenyl-4-trimethylacetyl-5-pyrazolino)terbium(III), bis[1-(9,9-dimethyl-9H-fluoren-2-yl)isoquinoline](acetylacetonato)iridium(III), bis(2-phenylbenzothiazolato)(acetylacetonato)iridium(III), bis(2-(9,9-dihexylfluorenyl)-1-pyridine)(acetylacetonato)iridium(III), bis(2-benzo[b]thiophen-2-yl-pyridine)(acetylacetonato)iridium(III).

In addition, the following commercially available materials are suitable: tris(dibenzoylacetonato)mono(phenanthroline)europium(III), tris(dibenzoylmethane)-mono(phenanthroline)europium(III), tris(dibenzoylmethane)mono(5-aminophenanthroline)europium(III), tris(di-2-naphthoylmethane)mono(phenanthroline)europium(III), tris (4-bromobenzoylmethane)mono(phenanthroline)europium (III), tris(di(biphenyl)-methane)mono(phenanthroline)europium(III), tris(dibenzoylmethane)mono(4,7-diphenylphenanthroline)europium(III), tris (dibenzoylmethane)mono(4,7-di-methyl-phenanthroline) europium(III), tris(dibenzoylmethane)mono(4,7-dimethylphenan-throlinedisulfonic acid)europium(III) disodium salt, tris[di(4-(2-(2-ethoxyethoxy)ethoxy)-benzoylmethane)]mono(phenanthroline)europium(III) and tris [d][4-(2-(2-ethoxy-ethoxy)ethoxy)benzoylmethane)]mono (5-aminophenanthroline)europium(III), osmium(II) bis(3-(trifluoromethyl)-5-(4-tert-butylpyridyl)-1,2,4-triazolato) diphenyl-methylphosphine, osmium(II) bis(3-(trifluoromethyl)-5-(2-pyridyl)-1,2,4-triazole)-dimethylphenylphosphine, osmium(II) bis(3-(trifluoromethyl)-5-(4-tert-butylpyridyl)-1,2,4-triazolato) dimethylphenylphosphine, osmium(II) bis(3-(trifluoromethyl)-5-(2-pyridyl)pyrazolato) dimethylphenylphosphine, tris[4,4'-di-tert-butyl(2,2')-bipyridine]-ruthenium(III), osmium(II) bis(2-(9,9-dibutylfluorenyl)-1-isoquinoline(acetylacetonate).

Preferred triplet emitters are carbene complexes. Suitable carbene complexes are known to those skilled in the art and are described, for example, in WO 2005/019373 A2, WO 2006/056418 A2, WO 2005/113704, WO 2007/115970, WO 2007/115981 and WO 2008/000727. Preferred carbene complexes are carbene complexes of the formula (I) mentioned above. Particularly preferred carbene complexes are carbene complexes of the formula (Ia) as mentioned above and (Ib).

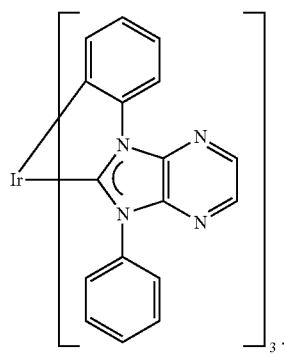

(Ib)

The light-emitting layer may comprise further components in addition to the emitter material.

For example, a fluorescent dye may be present in the light-emitting layer in order to alter the emission color of the emitter material. In addition—in a preferred embodiment—a matrix material can be used. This matrix material may be a polymer, for example poly(N-vinylcarbazole) or polysilane. The matrix material may, however, be a small molecule, for example 4, 4'-N,N'-dicarbazolebiphenyl (CDP=CBP) or tertiary aromatic amines, for example TCTA.

Suitable matrix materials are—in addition to the aforementioned matrix materials—in principle the materials specified hereinafter as hole and electron transport materials, and also carbon complexes, for example the carbene complexes mentioned in WO 2005/019373. Particularly suitable are carbazole derivatives, for example 4, 4'-bis(carbazol-9-yl)-2,2'-dimethylbiphenyl (CDBP), 4,4'-bis(carbazol-9-yl)biphenyl (CBP), 1,3-bis(N-carbazolyl)benzene (mCP), and the matrix materials specified in the following applications: WO2008/034758, WO2009/003919.

Dibenzofurans are additionally suitable as matrix materials, for example the dibenzofurans disclosed in US 2007/0224446 A1, for example those dibenzofurans in which at least one of the $R^1$ to $R^8$ radicals is a heterocyclic group, for example compound A-15, and the dibenzofurans disclosed in WO 2009/069442 A1, WO 2010/090077 A1 and JP 2006/321750 A.

Additional matrix materials on basis of dibenzofurane are, for example, described in US2009066226, EP1885818B1, EP1970976, EP1998388 and EP2034538.

Further suitable matrix materials, which may be small molecules or (co)polymers of the small molecules mentioned, are specified in the following publications:

WO2007108459 (H-1 to H-37), preferably H-20 to H-22 and H-32 to H-37, most preferably H-20, H-32, H-36, H-37, WO2008035571 A1 (Host 1 to Host 6), JP2010135467 (compounds 1 to 46 and Host-1 to Host-39 and Host-43), WO2009008100 compounds No. 1 to No. 67, preferably No. 3, No. 4, No. 7 to No. 12, No. 55, No. 59, No. 63 to No. 67, more preferably No. 4, No. 8 to No. 12, No. 55, No. 59, No. 64, No. 65, and No. 67, WO2009008099 compounds No. 1 to No. 110, WO2008140114 compounds 1-1 to 1-50, WO2008090912 compounds OC-7 to OC-36 and the polymers of Mo-42 to Mo-51, JP2008084913 H-1 to H-70, WO2007077810 compounds 1 to 44, preferably 1, 2, 4-6, 8, 19-22, 26, 28-30, 32, 36, 39-44, WO201001830 the polymers of monomers 1-1 to 1-9, preferably of 1-3, 1-7, and 1-9, WO2008029729 the (polymers of) compounds 1-1 to 1-36, WO20100443342 HS-1 to HS-101 and BH-1 to BH-17, preferably BH-1 to BH-17, JP2009182298 the (co)polymers based on the monomers 1 to 75, JP2009170764, JP2009135183 the (co)polymers based on the monomers 1-14, WO2009063757 preferably the (co)polymers based on the monomers 1-1 to 1-26, WO2008146838 the compounds a-1 to a-43 and 1-1 to 1-46, JP2008207520 the (co)polymers based on the monomers 1-1 to 1-26, JP2008066569 the (co) polymers based on the monomers 1-1 to 1-16, WO2008029652 the (co)polymers based on the monomers 1-1 to 1-52, WO2007114244 the (co)polymers based on the monomers 1-1 to 1-18, JP2010040830 the compounds HA-1 to HA-20, HB-1 to HB-16, HC-1 to HC-23 and the (co) polymers based on the monomers HD-1 to HD-12, JP2009021336, WO2010090077 the compounds 1 to 55, WO2010079678 the compounds H1 to H42, WO2010067746, WO2010044342 the compounds HS-1 to HS-101 and Poly-1 to Poly-4, JP2010114180 the compounds PH-1 to PH-36, US2009284138 the compounds 1 to 111 and H1 to H71, WO2008072596 the compounds 1 to 45, JP2010021336 the compounds H-1 to H-38, preferably H-1, WO2010004877 the compounds H-1 to H-60, JP2009267255 the compounds 1-1 to 1-105, WO2009104488 the compounds 1-1 to 1-38, WO2009086028, US2009153034, US2009134784, WO2009084413 the compounds 2-1 to 2-56, JP2009114369 the compounds 2-1 to 2-40, JP2009114370 the compounds 1 to 67, WO2009060742 the compounds 2-1 to 2-56, WO2009060757 the compounds 1-1 to 1-76, WO2009060780 the compounds 1-1 to 1-70, WO2009060779 the compounds 1-1 to 1-42, WO2008156105 the compounds 1 to 54, JP2009059767 the compounds 1 to 20, JP2008074939 the compounds 1 to 256, JP2008021687 the compounds 1 to 50, WO2007119816 the compounds 1 to 37, WO2010087222 the compounds H-1 to H-31, WO2010095564 the compounds HOST-1 to HOST-61, WO2007108362, WO2009003898, WO2009003919, WO2010040777, US2007224446 and WO06128800.

In a particularly preferred embodiment, one or more compounds of the general formula (X) specified hereinafter are used as matrix material. Preferred embodiments of the compounds of the general formula (X) are likewise specified hereinafter.

In a preferred embodiment, the present invention therefore relates to an organic electronic device, preferably an OLED, according to the present invention comprising at least one compound of the general formula (X), particularly preferable in combination with carbene complexes as triplet emitters

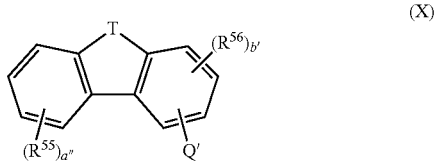

(X)

in which
T is NR$^{57}$, S, O or PR$^{57}$, preferably S or O, more preferably O;
R$^{57}$ is aryl, heteroaryl, alkyl, cycloalkyl or heterocycloalkyl;
Q' is —NR$^{58}$R$^{59}$, —SiR$^{70}$R$^{71}$R$^{72}$, —P(O)R$^{60}$R$^{61}$, —PR$^{62}$R$^{63}$, —S(O)$_2$R$^{64}$, —S(O)R$^{65}$, —SR$^{66}$ or —OR$^{67}$, preferably —NR$^{58}$R$^{59}$; more preferably

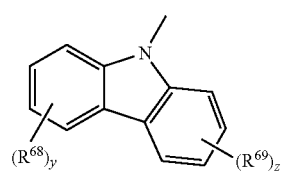

in which
R$^{68}$, R$^{69}$ are each independently alkyl, cycloalkyl, heterocycloalkyl, aryl or heteroaryl; preferably methyl, carbazolyl, dibenzofuryl or dibenzothienyl;
y, z are each independently 0, 1, 2, 3 or 4, preferably 0 or 1;
R$^{55}$, R$^{56}$ are each independently alkyl, cycloalkyl, heterocycloalkyl, aryl, heteroaryl, SiR$^{70}$R$^{71}$R$^{72}$, a Q' group or a group with donor or acceptor action;
a" is 0, 1, 2, 3 or 4;
b' is 0, 1, 2 or 3;
R$^{58}$, R$^{59}$ form, together with the nitrogen atom, a cyclic radical which has 3 to 10 ring atoms and may be unsubstituted or substituted by one or more substituents selected from alkyl, cycloalkyl, heterocycloalkyl, aryl, heteroaryl and a group with donor or acceptor action, and/or may be fused to one or more further cyclic radicals having 3 to 10 ring atoms, where the fused radicals may be unsubstituted or substituted by one or more substituents selected from alkyl, cycloalkyl, heterocycloalkyl, aryl, heteroaryl and a group with donor or acceptor action;
R$^{70}$, R$^{71}$, R$^{72}$, R$^{60}$, R$^{61}$, R$^{62}$, R$^{63}$, R$^{64}$, R$^{65}$, R$^{66}$, R$^{67}$
are each independently aryl, heteroaryl, alkyl, cycloalkyl or heterocycloalkyl,
or
two units of the general formula (X) are bridged to one another via a linear or branched, saturated or unsaturated bridge optionally interrupted by at least one heteroatom, via a bond or via O.

Preference is given to compounds of the formula (X) in which:
T is S or O, preferably O, and
Q' is

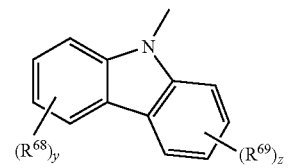

in which
R$^{68}$, R$^{69}$ are each independently alkyl, cycloalkyl, heterocycloalkyl, aryl or heteroaryl; preferably methyl, carbazolyl, dibenzofuryl or dibenzothienyl;
y, z are each independently 0, 1, 2, 3 or 4, preferably 0 or 1.

Particularly preferred compounds of the formula (X) have the following formula (Xa):

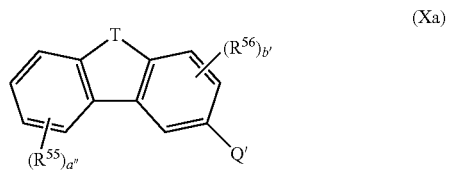

(Xa)

in which the symbols and indices Q', T, R$^{55}$, R$^{56}$, a" and b' are each as defined above.

Very particularly preferred compounds of the formula (X) have the formula (Xaa):

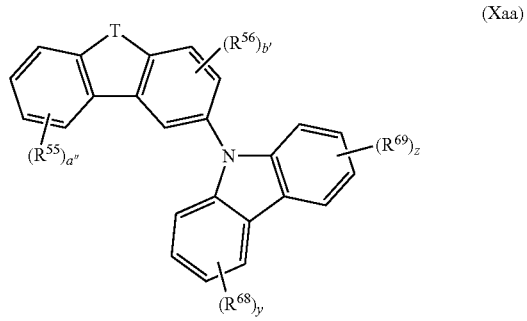

(Xaa)

in which the symbols and indices R$^{68}$, R$^{69}$ y, z, T, R$^{55}$, R$^{56}$, a" and b' are each as defined above.

In a very particularly preferred embodiment, in formula (Xaa):
T is O or S, preferably O;
a" is 1;
b' is 0;
y, z are each independently 0 or 1; and
$R^{68}$, $R^{69}$ are each independently methyl, carbazolyl, dibenzofuryl or dibenzothienyl
$R^{55}$ is substituted phenyl, carbazolyl, dibenzofuryl or dibenzothienyl.

Further very particularly preferred compounds of the formula (X) have the formula (Xab)

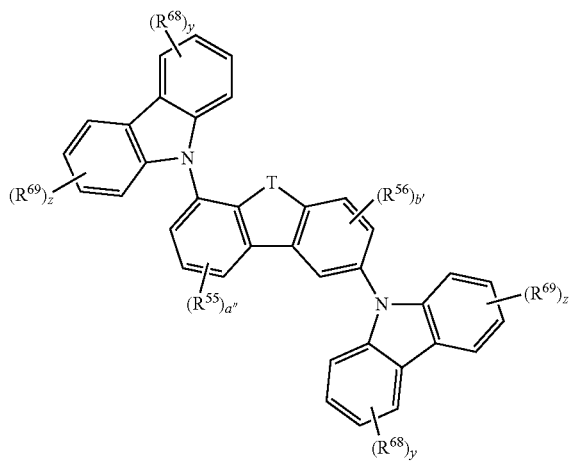

(Xab)

wherein the symbols and indices $R^{68}$, $R^{69}$ y, z, T, $R^{55}$, $R^{56}$, a" and b' each independently have the meanings mentioned before.

In a particularly preferred embodiment the symbols and indices in formula (Xab) have the following meanings:
T O or S, preferably O;
a" 0;
b' 0;
y, z unabhängig voneinander 0 oder 1; and
$R^{68}$, $R^{69}$ unabhängig voneinander Methyl, Carbazolyl, Dibenzofuryl oder Dibenzothienyl.

A particularly preferred compound of formula (Xab) is the following compound:

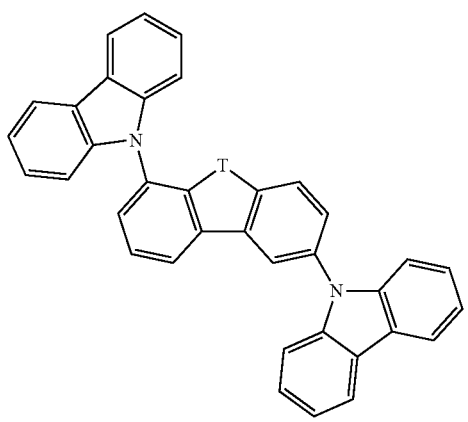

wherein T is O or S, preferably O.

The compounds of the formula (X) may be for example prepared as described in WO2010079051, WO2007/077810, JP2009267255 respectively US20090017331 A1 and WO2009/003898 or analogeous to the preparation processes described in the documents mentioned before.

In a further preferred embodiment of the present invention, at least one compound of the formula (V) is used as matrix material, particularly preferable with carbene complexes as triplet emitters.

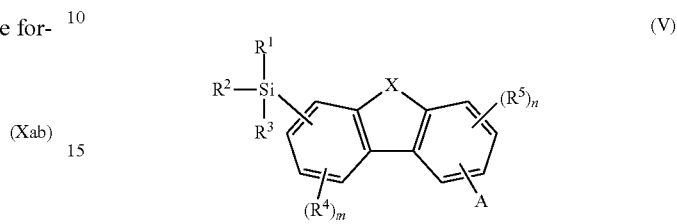

(V)

wherein
X is NR, S, O or PR;
R is aryl, heteroaryl, alkyl, cycloalkyl, or heterocycloalkyl;
A is —$NR^6R^7$, —$P(O)R^8R^9$, —$PR^{10}R^{11}$, —$S(O)_2R^{12}$, —$S(O)R^{13}$, —$SR^{14}$, or —$OR^{15}$;
$R^1$, $R^2$ and $R^3$ are independently of each other aryl, heteroaryl, alkyl, cycloalkyl, or heterocycloalkyl, wherein at least on of the groups $R^1$, $R^2$, or $R^3$ is aryl, or heteroaryl;
$R^4$ and $R^5$ are independently of each other alkyl, cycloalkyl, heterocycloalkyl, aryl, heteroaryl, a group A, or a group having donor, or acceptor characteristics;
n and m are independently of each other 0, 1, 2, or 3;
$R^6$, $R^7$ form together with the nitrogen atom a cyclic residue having 3 to 10 ring atoms, which can be unsubstituted, or which can be substituted with one, or more substituents selected from alkyl, cycloalkyl, heterocycloalkyl, aryl, heteroaryl and a group having donor, or acceptor characteristics; and/or which can be annulated with one, or more further cyclic residues having 3 to 10 ring atoms, wherein the annulated residues can be unsubstituted, or can be substituted with one, or more substituents selected from alkyl, cycloalkyl, heterocycloalkyl, aryl, heteroaryl and a group having donor, or acceptor characteristics; and
$R^8$, $R^9$, $R^{10}$, $R^{11}$, $R^{12}$, $R^{13}$, $R^{14}$ and $R^{15}$ are independently of each other aryl, heteroaryl, alkyl, cycloalkyl, or heterocycloalkyl.

Compounds of formula (V) are described in WO2010079051 (PCT/EP2009/067120).

For the compounds of the general formula (X), especially for the $R^{55}$ to $R^{77}$ radicals and for the compounds of the general formula (V), especially for the $R^1$ to $R^{15}$ radicals:

The terms aryl radical or group, heteroaryl radical or group, alkyl radical or group, cycloalkyl radical or group, heterocycloalkyl radical or group, alkenyl radical or group, alkynyl radical or group, and groups with donor and/or acceptor action are each defined as follows:

An aryl radical (or group) is understood to mean a radical having a base skeleton of 6 to 30 carbon atoms, preferably 6 to 18 carbon atoms, which is formed from an aromatic ring or a plurality of fused aromatic rings. Suitable base skeletons are, for example, phenyl, naphthyl, anthracenyl or phenanthrenyl, indenyl or fluorenyl. This base skeleton may be unsubstituted (which means that all carbon atoms which are substitutable bear hydrogen atoms), or may be substituted at one, more than one or all substitutable positions of the base skeleton.

Suitable substituents are, for example, deuterium, alkoxy radicals, aryloxy radicals, alkylamino groups, arylamino groups, carbazolyl groups, silyl groups, SiR$^{78}$R$^{79}$R$^{80}$, suitable silyl groups SiR$^{78}$R$^{79}$R$^{80}$ being specified below, alkyl radicals, preferably alkyl radicals having 1 to 8 carbon atoms, more preferably methyl, ethyl or i-propyl, aryl radicals, preferably C$_6$-aryl radicals, which may in turn be substituted or unsubstituted, heteroaryl radicals, preferably heteroaryl radicals which comprise at least one nitrogen atom, more preferably pyridyl radicals and carbazolyl radicals, alkenyl radicals, preferably alkenyl radicals which bear one double bond, more preferably alkenyl radicals having one double bond and 1 to 8 carbon atoms, alkynyl radicals, preferably alkynyl radicals having one triple bond, more preferably alkynyl radicals having one triple bond and 1 to 8 carbon atoms or groups with donor or acceptor action. Suitable groups with donor or acceptor action are specified below. The substituted aryl radicals most preferably bear substituents selected from the group consisting of methyl, ethyl, isopropyl, alkoxy, heteroaryl, halogen, pseudohalogen and amino, preferably arylamino. The aryl radical or the aryl group is preferably a C$_6$-C$_{18}$-aryl radical, more preferably a C$_6$-aryl radical, which is optionally substituted by at least one or more than one of the aforementioned substituents. The C$_6$-C$_{18}$-aryl radical, preferably C$_6$-aryl radical, more preferably has none, one, two, three or four, most preferably none, one or two, of the aforementioned substituents.

A heteroaryl radical or a heteroaryl group is understood to mean radicals which differ from the aforementioned aryl radicals in that at least one carbon atom in the base skeleton of the aryl radicals is replaced by a heteroatom, and in that the base skeleton of the heteroaryl radicals preferably has 5 to 18 ring atoms. Preferred heteroatoms are N, O and S. Heteroaryl radicals suitable with particular preference are nitrogen-containing heteroaryl radicals. Most preferably, one or two carbon atoms of the base skeleton are replaced by heteroatoms, preferably nitrogen. The base skeleton is especially preferably selected from systems such as pyridine, pyrimidine and five-membered heteroaromatics such as pyrrole, furan, pyrazole, imidazole, thiophene, oxazole, thiazole, triazole. In addition, the heteroaryl radicals may be fused ring systems, for example benzofuryl, benzothienyl, benzopyrrolyl, dibenzofuryl, dibenzothienyl, phenanthrolinyl, carbazolyl radicals, azacarbazolyl radicals or diazacarbazolyl radicals. The base skeleton may be substituted at one, more than one or all substitutable positions of the base skeleton. Suitable substituents are the same as have already been specified for the aryl groups.

An alkyl radical or an alkyl group is understood to mean a radical having 1 to 20 carbon atoms, preferably 1 to 10 carbon atoms, more preferably 1 to 8, most preferably 1 to 4 carbon atoms. This alkyl radical may be branched or unbranched and optionally be interrupted by one or more heteroatoms, preferably Si, N, O or S, more preferably N, O or S. In addition, this alkyl radical may be substituted by one or more of the substituents specified for the aryl groups. In addition, the alkyl radicals present in accordance with the invention may have at least one halogen atom, for example F, Cl, Br or I, especially F. In a further embodiment, the alkyl radicals present in accordance with the invention may be fully fluorinated. It is likewise possible that the alkyl radical bears one or more (hetero)aryl groups. In the context of the present application, for example, benzyl radicals are thus substituted alkyl radicals. In this context, all of the (hetero)aryl groups listed above are suitable. The alkyl radicals are more preferably selected from the group consisting of methyl, ethyl, isopropyl, n-propyl, n-butyl, iso-butyl and tert-butyl, very particular preference being given to methyl and ethyl.

A cycloalkyl radical or a cycloalkyl group is understood to mean a radical having 3 to 20 carbon atoms, preferably 3 to 10 carbon atoms, more preferably 3 to 8 carbon atoms. This base skeleton may be unsubstituted (which means that all carbon atoms which are substitutable bear hydrogen atoms) or substituted at one, more than one or all substitutable positions of the base skeleton. Suitable substituents are the groups already mentioned above for the aryl radicals. It is likewise possible that the cycloalkyl radical bears one or more (hetero)aryl groups. Examples of suitable cycloalkyl radicals are cyclopropyl, cyclopentyl and cyclohexyl.

A heterocycloalkyl radical or a heterocycloalkyl group is understood to mean radicals which differ from the aforementioned cycloalkyl radicals in that at least one carbon atom in the base skeleton of the cycloalkyl radicals is replaced by a heteroatom. Preferred heteroatoms are N, O and S. Most preferably, one or two carbon atoms of the base skeleton of the cycloalkyl radicals are replaced by heteroatoms. Examples of suitable heterocycloalkyl radicals are radicals derived from pyrrolidine, piperidine, piperazine, tetrahydrofuran, dioxane.

An alkenyl radical or an alkenyl group is understood to mean a radical which corresponds to the aforementioned alkyl radicals having at least two carbon atoms, with the difference that at least one C—C single bond of the alkyl radical is replaced by a C—C double bond. The alkenyl radical preferably has one or two double bonds.

An alkynyl radical or an alkynyl group is understood to mean a radical which corresponds to the aforementioned alkyl radicals having at least two carbon atoms, with the difference that at least one C—C single bond of the alkyl radical is replaced by a C—C triple bond. The alkynyl radical preferably has one or two triple bonds.

An SiR$^{78}$R$^{79}$R$^{80}$ group is understood to mean a silyl radical in which
R$^{78}$, R$^{79}$ and R$^{80}$ are each independently alkyl, cycloalkyl, heterocycloalkyl, aryl, heteroaryl or OR$^{73}$.

An SiR$^{74}$R$^{75}$R$^{76}$ group is understood to mean a silyl radical in which
R$^{74}$, R$^{75}$ and R$^{76}$ are each independently alkyl, cycloalkyl, heterocycloalkyl, aryl, heteroaryl or OR$^{73}$.

In the context of the present application, a group or a substituent with donor or acceptor action is understood to mean the following groups:

Groups with donor action are understood to mean groups which have a +I and/or +M effect, and groups with acceptor action are understood to mean groups which have a −I and/or −M effect. Preferred suitable groups are selected from C$_1$-C$_{20}$-alkoxy, C$_6$-C$_{30}$-aryloxy, C$_1$-C$_{20}$-alkylthio, C$_6$-C$_{30}$-arylthio, SiR81"R82"R83",OR$^{73}$, halogen radicals, halogenated C$_1$-C$_{20}$-alkyl radicals, carbonyl (—CO(R81")), carbonylthio (—C═O(SR81")), carbonyloxy (—C═O(OR81")), oxycarbonyl (—OC═O(R81")), thiocarbonyl (—SC═O(R81")), amino (—NR81"R82"), pseudohalogen radicals, amido (—C═O(NR81")), —NR81"C═O(R83"), phosphonate (—P(O) (OR81")$_2$, phosphate (—OP(O)(OR81")$_2$), phosphine (—PR81"R82"), phosphine oxide (—P(O)R81"$_2$), sulfate (—OS(O)$_2$OR81"), sulfoxide (—S(O)R81"), sulfonate (—S(O)$_2$OR81"), sulfonyl (—S(O)$_2$R81", sulfonamide (—S(O)$_2$NR81"R82"), NO$_2$, boronic esters (—OB(OR81")$_2$), imino (—C═NR81"R82")), borane radicals, stannane radicals, hydrazine radicals, hydrazone radicals, oxime radicals, nitroso groups, diazo groups, vinyl groups, sulfoximines, alanes, germanes, boroximes and borazines.

The R81", R82" and R83" radicals mentioned in the aforementioned groups with donor or acceptor action are each independently:
substituted or unsubstituted $C_1$-$C_{20}$-alkyl or substituted or unsubstituted $C_6$-$C_{30}$-aryl, or $OR^{76}$, suitable and preferred alkyl and aryl radicals having been specified above. The R81", R82" and R83" radicals are more preferably $C_1$-$C_6$-alkyl, e.g. methyl, ethyl or i-propyl, or phenyl. In a preferred embodiment—in the case of SiR81"R82"R83"-R81", R82" and R83" are preferably each independently substituted or unsubstituted $C_1$-$C_{20}$-alkyl or substituted or unsubstituted aryl, preferably phenyl.

Preferred substituents with donor or acceptor action are selected from the group consisting of:
$C_1$- to $C_{20}$-alkoxy, preferably $C_1$-$C_6$-alkoxy, more preferably ethoxy or methoxy; $C_6$-$C_{30}$-aryloxy, preferably $C_6$-$C_{10}$-aryloxy, more preferably phenyloxy; SiR81"R82"R83" where R81", R82" and R83" are preferably each independently substituted or unsubstituted alkyl or substituted or unsubstituted aryl, preferably phenyl; more preferably, at least one of the R81", R82" and R83" radicals is substituted or unsubstituted phenyl, suitable substituents having been specified above; halogen radicals, preferably F, Cl, more preferably F, halogenated $C_1$-$C_{20}$-alkyl radicals, preferably halogenated $C_1$-$C_6$-alkyl radicals, most preferably fluorinated $C_1$-$C_6$-alkyl radicals, e.g. $CF_3$, $CH_2F$, $CHF_2$ or $C_2F_5$; amino, preferably dimethylamino, diethylamino or diarylamino, more preferably diarylamino; pseudohalogen radicals, preferably CN, —C(O)O$C_1$-$C_4$-alkyl, preferably —C(O)OMe, P(O)$R_2$, preferably P(O)$Ph_2$.

Very particularly preferred substituents with donor or acceptor action are selected from the group consisting of methoxy, phenyloxy, halogenated $C_1$-$C_4$-alkyl, preferably $CF_3$, $CH_2F$, $CHF_2$, $C_2F_5$, halogen, preferably F, CN, SiR81"R82"R83", suitable R81", R82" and R83" radicals already having been specified, diarylamino (NR84"R85" where R84", R85" are each $C_6$-$C_{30}$-aryl), —C(O)O$C_1$-$C_4$-alkyl, preferably —C(O)OMe, P(O)$Ph_2$.

Halogen groups are preferably understood to mean F, Cl and Br, more preferably F and Cl, most preferably F.

Pseudohalogen groups are preferably understood to mean CN, SCN and OCN, more preferably CN.

The aforementioned groups with donor or acceptor action do not rule out the possibility that further radicals and substituents mentioned in the present application, but not included in the above list of groups with donor or acceptor action, have donor or acceptor action.

The aryl radicals or groups, heteroaryl radicals or groups, alkyl radicals or groups, cycloalkyl radicals or groups, heterocycloalkyl radicals or groups, alkenyl radicals or groups and groups with donor and/or acceptor action may—as mentioned above—be substituted or unsubstituted. In the context of the present application, an unsubstituted group is understood to mean a group in which the substitutable atoms of the group bear hydrogen atoms. In the context of the present application, a substituted group is understood to mean a group in which one or more substitutable atom(s) bear(s) a substituent in place of a hydrogen atom at least at one position. Suitable substituents are the substituents specified above for the aryl radicals or groups.

When radicals having the same numbering occur more than once in the compounds according to the present application, these radicals may each independently have the definitions specified.

The T radical in the compounds of the formula (X) is $NR^{57}$, S, O or $PR^{57}$, preferably $NR^{57}$, S or O, more preferably O or S, most preferably O. The X radical in formula (V) is NR, S, O or PR, more preferably O or S, most preferably O;

The $R^{57}$ radical is aryl, heteroaryl, alkyl, cycloalkyl or heterocycloalkyl, preferably aryl, heteroaryl or alkyl, more preferably aryl, where the aforementioned radicals may be unsubstituted or substituted. Suitable substituents have been specified above. $R^{57}$ is more preferably phenyl which may be substituted by the aforementioned substituents or unsubstituted. $R^{57}$ is most preferably unsubstituted phenyl.

The R radical is aryl, heteroaryl, alkyl, cycloalkyl, or heterocycloalkyl, where the aforementioned radicals may be unsubstituted or substituted. Suitable substituents have been specified above. R is more preferably phenyl which may be substituted by the aforementioned substituents or unsubstituted. R is most preferably unsubstituted phenyl.

The Q' group in the compounds of the formula (X) is —$NR^{58}R^{59}$, —P(O)$R^{60}R^{61}$, $PR^{62}R^{63}$, —S(O)$_2R^{64}$, —S(O)$R^{65}$, —$SR^{66}$ or —$OR^{67}$; preferably $NR^{58}R^{59}$, —P(O)$R^{60}R^{61}$ or —$OR^{67}$, more preferably —$NR^{58}R^{59}$.

The A group in the compounds of the formula (V) is —$NR^6R^7$, —P(O)$R^8R^9$, —$PR^{10}R^{11}$, S(O)$_2R^{12}$, —S(O)$R^{13}$, —$SR^{14}$, or —$OR^{15}$, preferably —$NR^6R^7$, —P(O)$R^8R^9$ or —$OR^{15}$, more preferably —$NR^6R^7$.

The $R^{58}$ to $R^{67}$ and $R^{74}$ to $R^{76}$ and the $R^6$ to $R^{15}$ radicals are each defined as follows:

$R^{58}$, $R^{59}$, $R^6$, $R^7$ form, together with the nitrogen atom, a cyclic radical which has 3 to 10 ring atoms and may be unsubstituted or substituted by one or more substituents selected from alkyl, cycloalkyl, heterocycloalkyl, aryl, heteroaryl and a group with donor or acceptor action and/or may be fused to one or more further cyclic radicals having 3 to 10 ring atoms, where the fused radicals may be unsubstituted or substituted by one or more substituents selected from alkyl, cycloalkyl, heterocycloalkyl, aryl, heteroaryl and a group with donor or acceptor action;

$R^{60}$, $R^{61}$, $R^{62}$, $R^{63}$, $R^{64}$, $R^{65}$, $R^{66}$, $R^{67}$, $R^{74}$, $R^{75}$, $R^{76}$, $R^8$, $R^9$, $R^{10}$, $R^{11}$, $R^{12}$, $R^{13}$, $R^{14}$, $R^{15}$ are each independently aryl, heteroaryl, alkyl, cycloalkyl or heterocycloalkyl, preferably aryl or heteroaryl, where the radicals may be unsubstituted or substituted by one or more of the radicals selected from alkyl, cycloalkyl, heterocycloalkyl, aryl, heteroaryl and a group with donor or acceptor action, more preferably unsubstituted or substituted phenyl, suitable substituents having been specified above, for example tolyl or a group of the formula

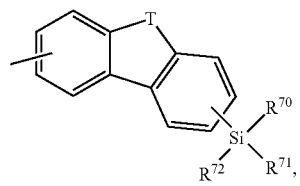

in which the T group and the $R^{70}$, $R^{71}$ and $R^{72}$ radicals are each independently as defined for the compounds of the formula (X).

$R^{60}$, $R^{61}$, $R^{62}$, $R^{63}$, $R^{64}$, $R^{65}$, $R^{66}$ and $R^{67}$ and $R^8$, $R^9$, $R^{10}$, $R^{11}$, $R^{12}$, $R^{13}$, $R^{14}$, $R^{15}$ are most preferably each independently phenyl, tolyl or a group of the formula

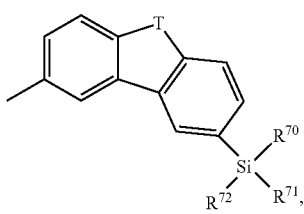

in which T is NPh, S or O.

Examples of —NR$^{58}$R$^{59}$ groups and —NR$^{6}$R$^{7}$ groups suitable with preference are selected from the group consisting of pyrrolyl, 2,5-dihydro-1-pyrrolyl, pyrrolidinyl, indolyl, indolinyl, isoindolinyl, carbazolyl, azacarbazolyl, diazacarbazolyl, imidazolyl, imidazolinyl, benzimidazolyl, pyrazolyl, indazolyl, 1,2,3-triazolyl, benzotriazolyl, 1,2,4-triazolyl, tetrazolyl, 1,3-oxazolyl, 1,3-thiazolyl, piperidyl, morpholinyl, 9,10-dihydroacridinyl and 1,4-oxazinyl, where the aforementioned groups may be unsubstituted or substituted by one or more substituents selected from alkyl, cycloalkyl, heterocycloalkyl, aryl, heteroaryl and a group with donor or acceptor action; the —NR$^{6}$R$^{7}$ group and —NR$^{58}$R$^{59}$ group are independently preferably selected from carbazolyl, pyrrolyl, indolyl, imidazolyl, benzimidazolyl, azacarbazolyl and diazacarbazolyl, where the aforementioned groups may be unsubstituted or substituted by one or more substituents selected from alkyl, cycloalkyl, heterocycloalkyl, aryl, heteroaryl and a group with donor or acceptor action; the —NR$^{58}$R$^{59}$ group and —NR$^{6}$R$^{7}$ group are independently more preferably carbazolyl which may be unsubstituted or substituted by one or more substituents selected from alkyl, cycloalkyl, heterocycloalkyl, aryl, heteroaryl and a group with donor or acceptor action.

Particularly preferred —NR$^{58}$R$^{59}$ and —NR$^{6}$R$^{7}$ groups are:

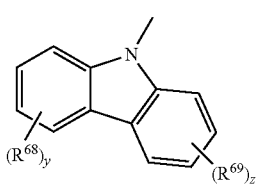

in which

R$^{88}$, R$^{69}$ are each independently alkyl, cycloalkyl, heterocycloalkyl, aryl or heteroaryl; preferably methyl, carbazolyl, dibenzofuryl or dibenzothienyl;

y, z are each independently 0, 1, 2, 3 or 4, preferably 0 or 1; for example:

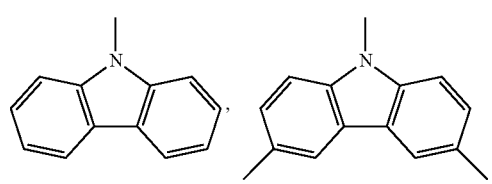

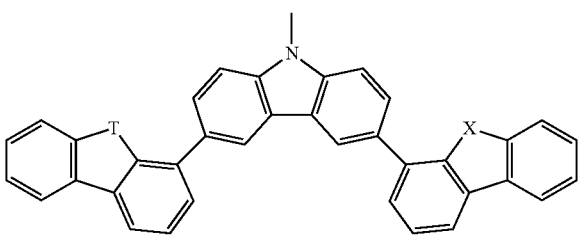

in which X and T are independently NPh, S or O;

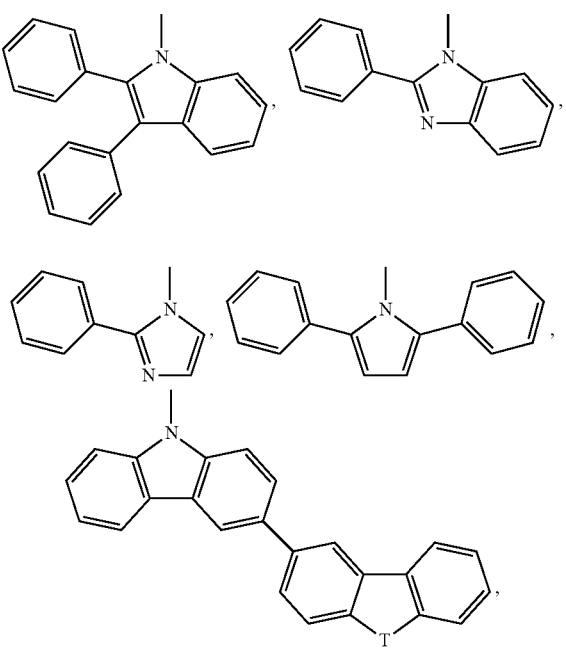

in which T is NPh, S or O,

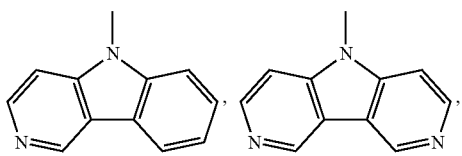

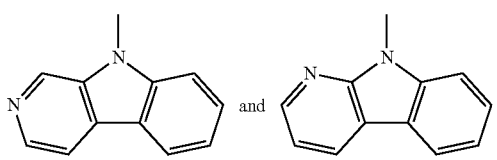

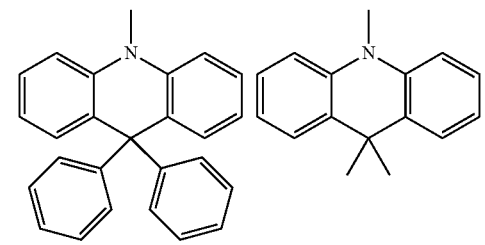

$R^{55}$, $R^{56}$ in the compounds of the formula (X) and $R^4$, $R^5$ in the compounds of formula (V) are each independently alkyl, cycloalkyl, heterocycloalkyl, aryl, heteroaryl, a further A group or a group with donor or acceptor action; preferably each independently alkyl, aryl, heteroaryl or a group with donor or acceptor action. For example, $R^{55}$ or $R^{56}$ or $R^4$ or $R^5$ may each independently be:

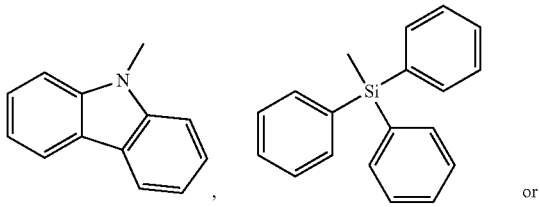
or
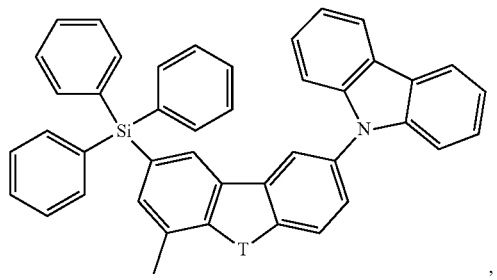
,
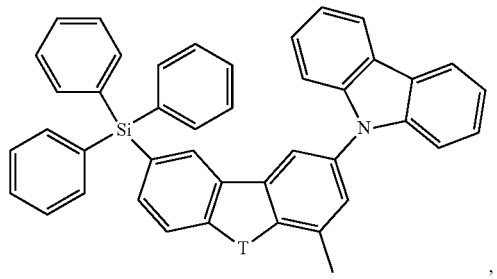
, in which T is NPh, S or O.

In the compounds of the formula (X) a" $R^{55}$ groups and/or b' $R^{56}$ groups may be present, where a" and b' are:
a" is 0, 1, 2, 3 or 4; preferably independently 0, 1 or 2;
b' is 0, 1, 2 or 3; preferably independently 0, 1 or 2.

Most preferably at least a" or b' is 0, very especially preferably a" and b' are each 0 or a" is 1 and b' is 1.

In the compounds of the formula (V) m $R^4$ groups and/or n' $R^5$ groups may be present, where m and n are:
m is 0, 1, 2, 3 or 4; preferably independently 0, 1 or 2;
n is 0, 1, 2 or 3; preferably independently 0, 1 or 2.

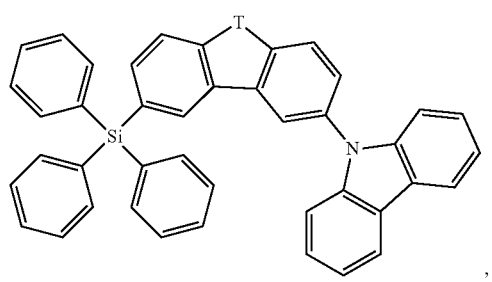
,

Most preferably at least m or n is 0, very especially preferably m and n are each 0 or m is 1 and n is 0.

Further preferred compounds of the general formula (V) correspond to the following formula (XI)

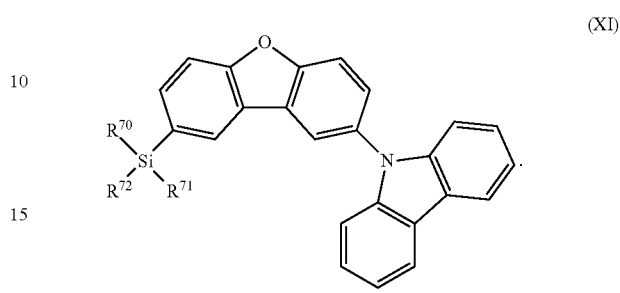
(XI)

wherein
$R^{70}$, $R^{71}$, $R^{72}$ are each independently aryl, heteroaryl, alkyl, cycloalkyl or heterocycloalkyl.

Preferred examples of compounds of formula (V) are:

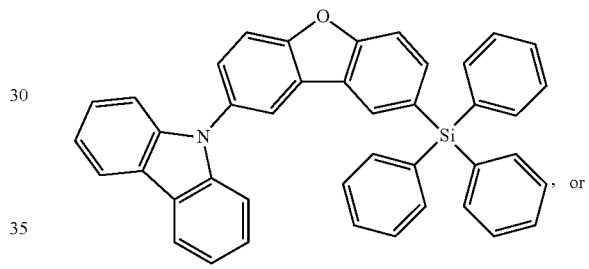
, or

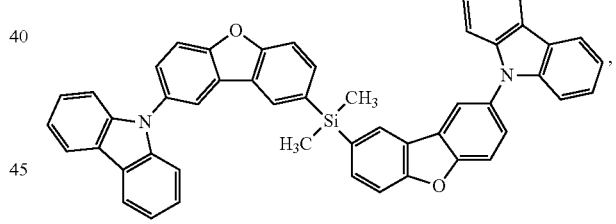
,

Said compounds are described in WO2010079051 (PCT/EP2009/067120; in particular pages on 19 to 26 and in tables on pages 27 to 34, pages 35 to 37 and pages 42 to 43).

Examples of particularly preferred matrix materials are shown below:

-continued
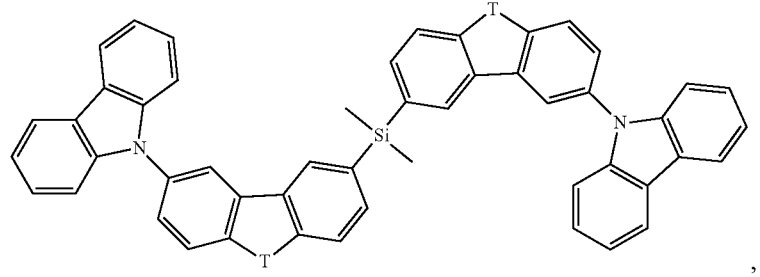,
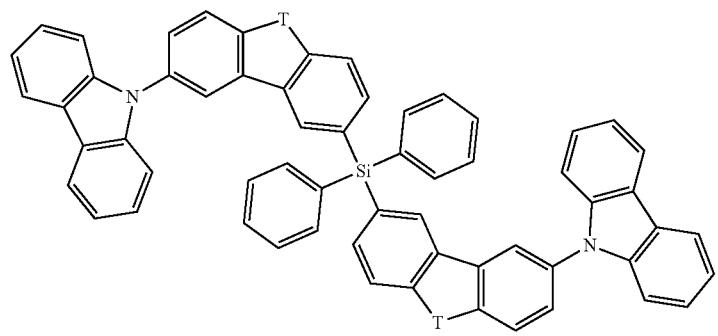,
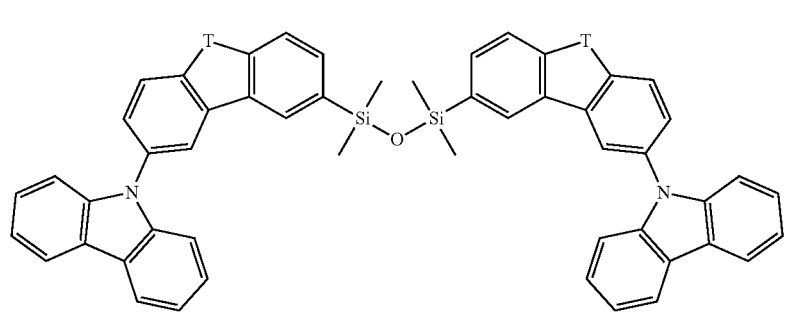,
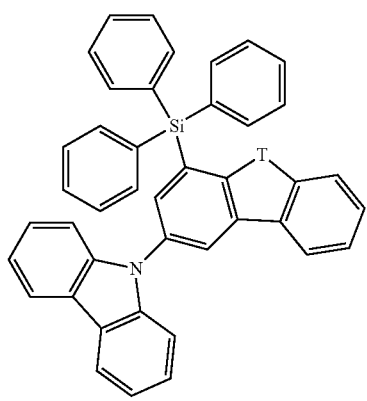,
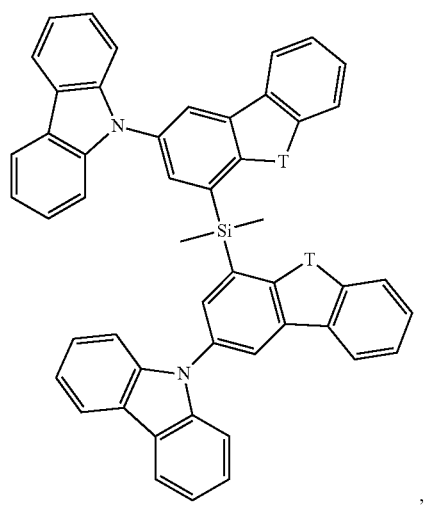,
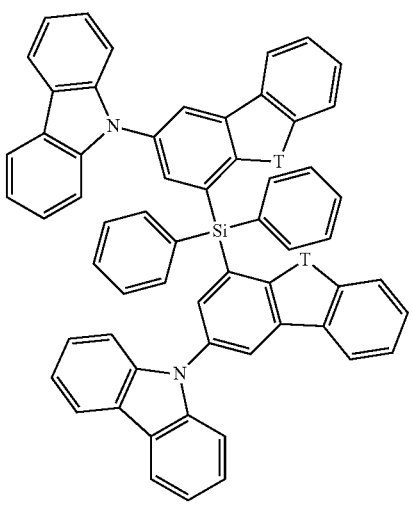, -continued
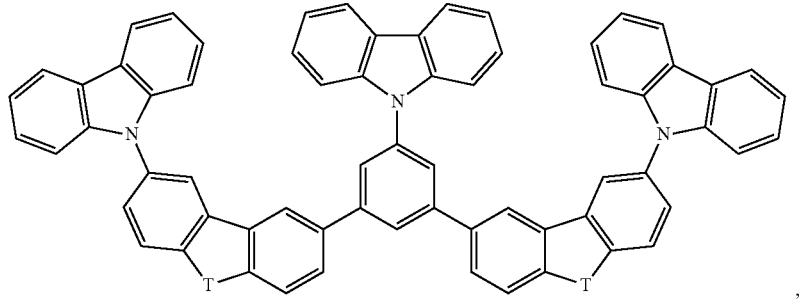
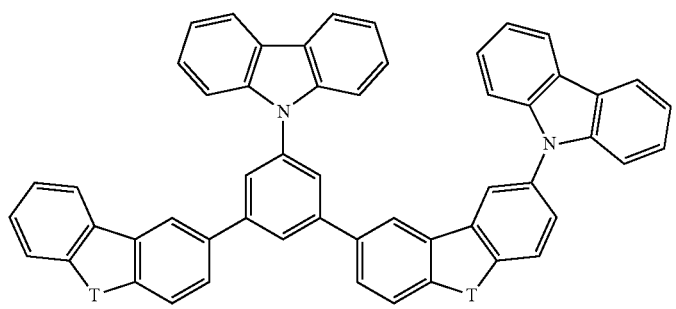
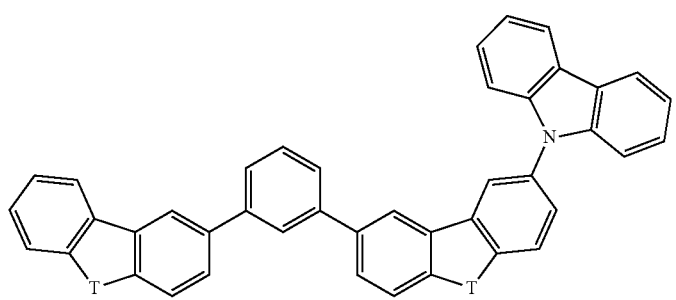
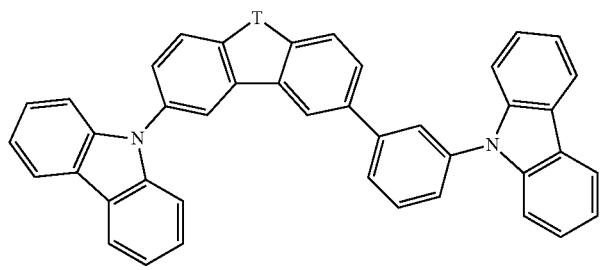
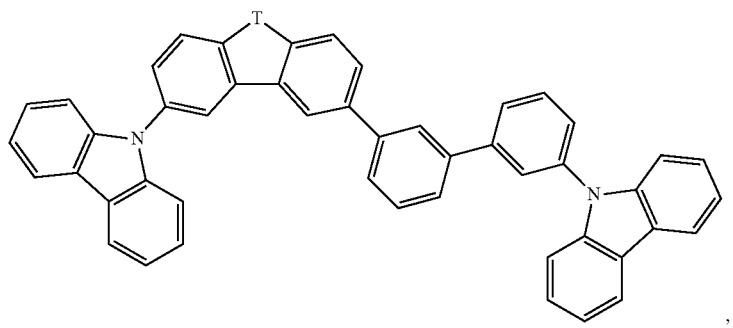

-continued
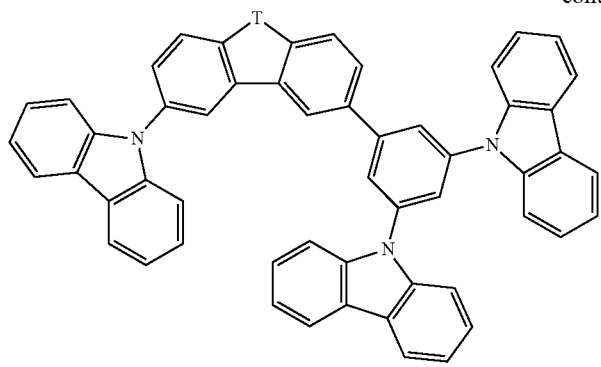
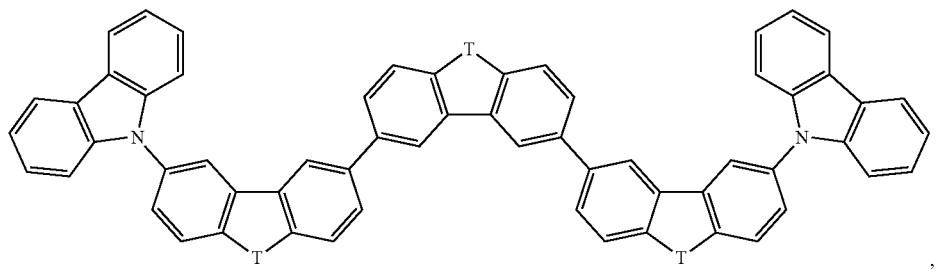
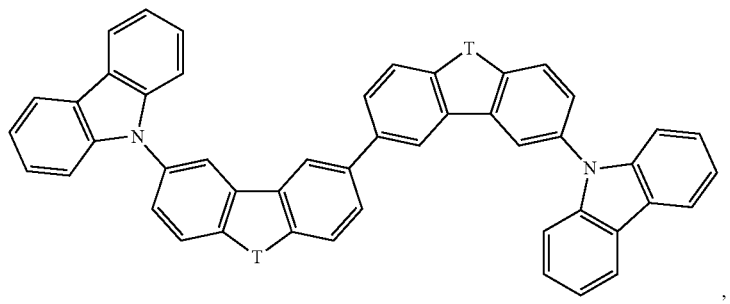
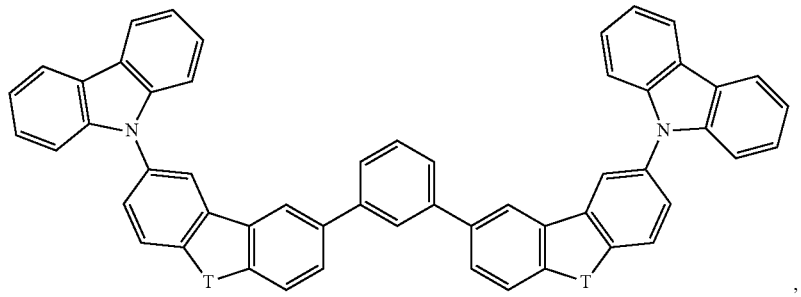
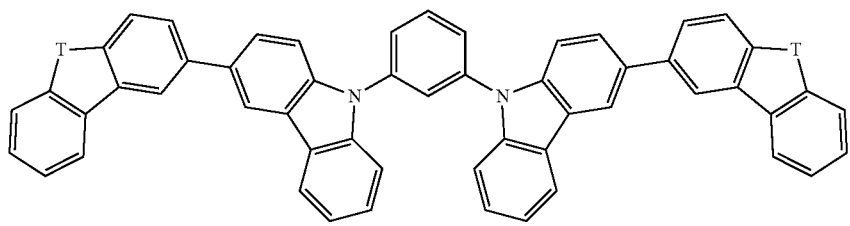

-continued
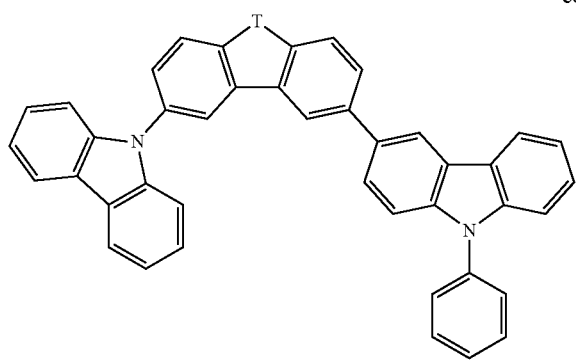
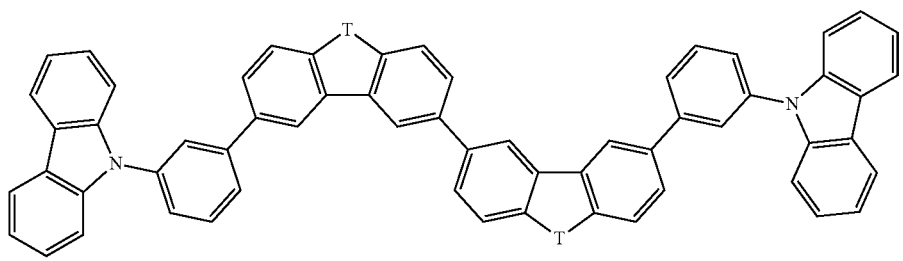
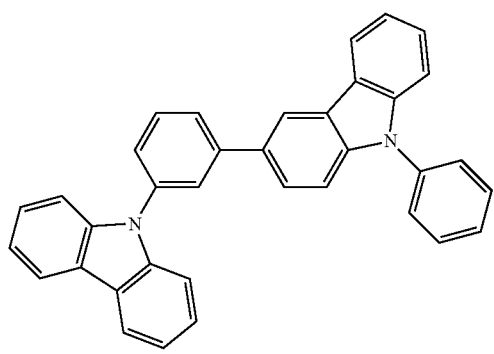
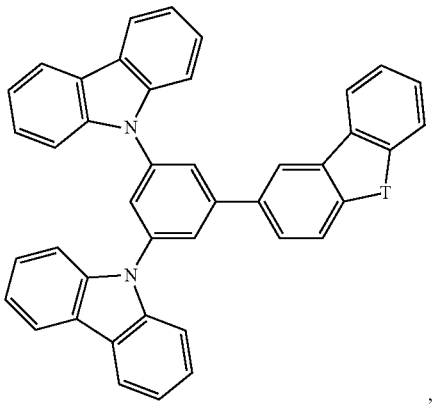
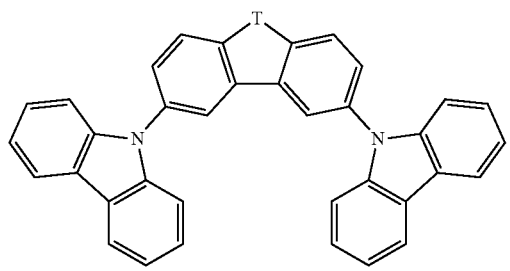
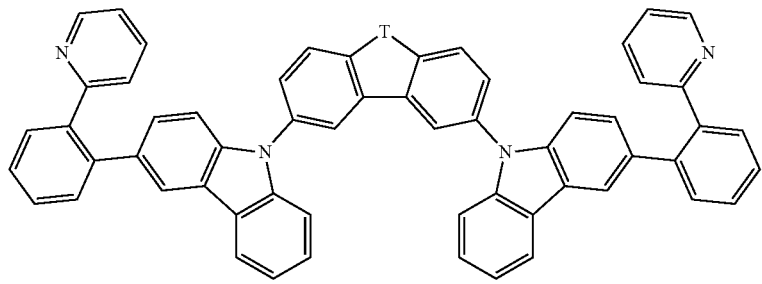

-continued
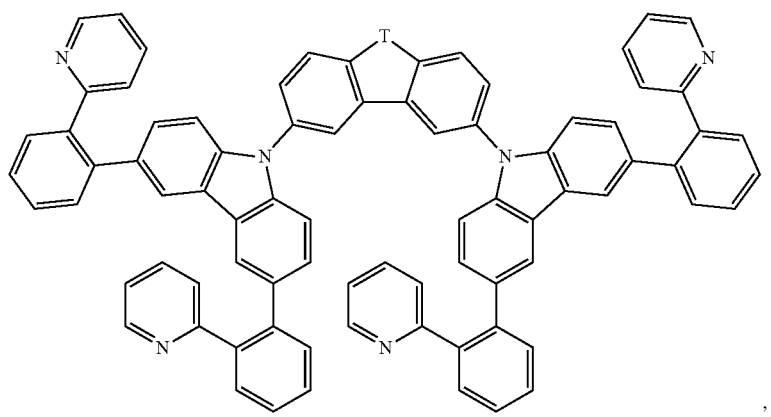
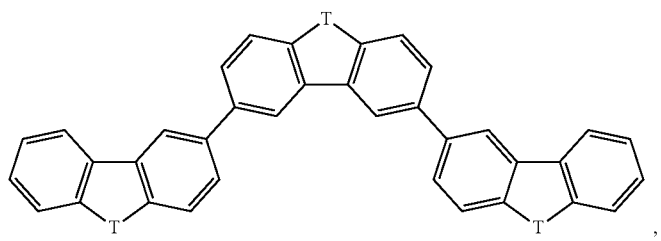
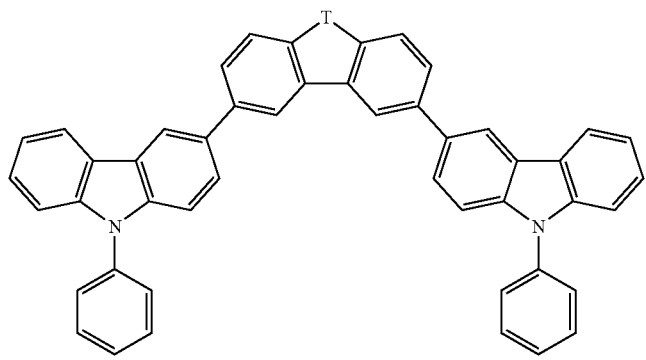
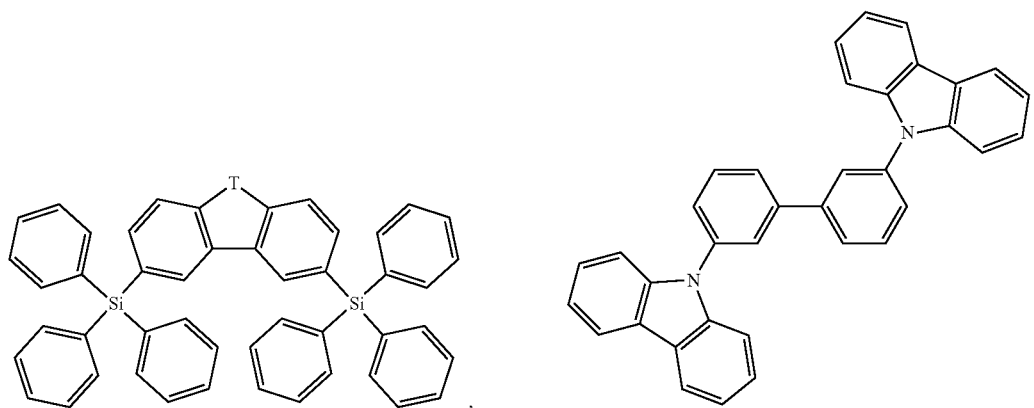
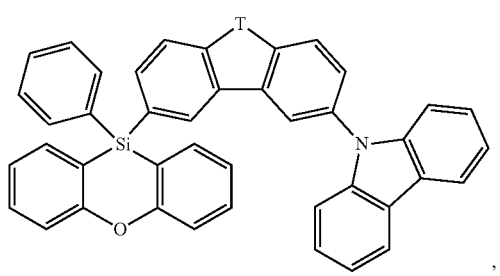
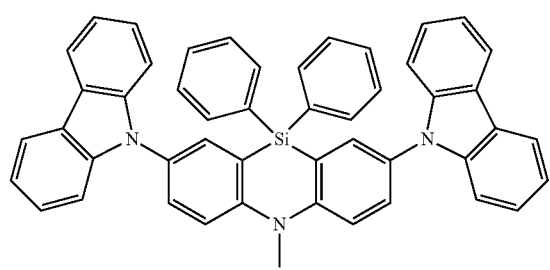

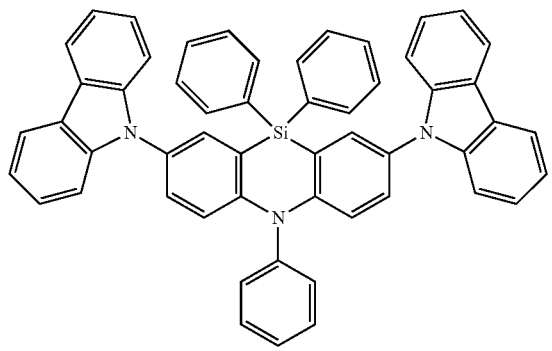

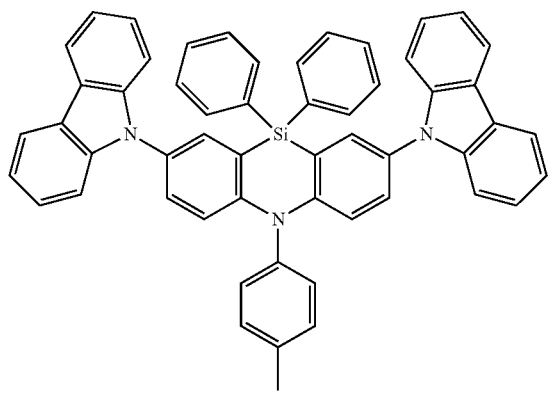

and

In the above-mentioned compounds T is O, or S, preferably O. If T occurs more than one time in a molecule, all groups T have the same meaning.

Further, the light emitting layer may comprise further carbene complexes as additional or sole matrix material and/or as additional emitter material. Suitable further carbene complexes are the same carbene complexes as mentioned before, especially carbene complexes of formula (I).

In a preferred embodiment, the light-emitting layer is formed from 2 to 70% by weight, preferably 5 to 40% by weight, of at least one of the aforementioned emitter materials and 30 to 98% by weight, preferably 60 to 95% by weight, of at least one of the aforementioned matrix materials—in one embodiment at least one compound of the formula (V)— where the sum total of the emitter material and of the matrix material adds up to 100% by weight.

In a preferred embodiment, the light-emitting layer comprises at least one of the aforementioned matrix materials—in one embodiment a compound of formula (V)—, such as, for example,

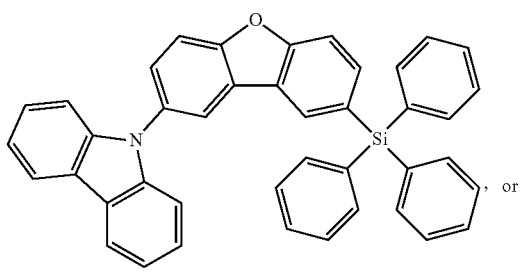

, or

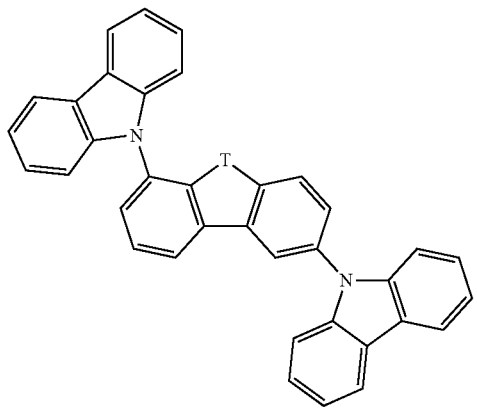

-continued

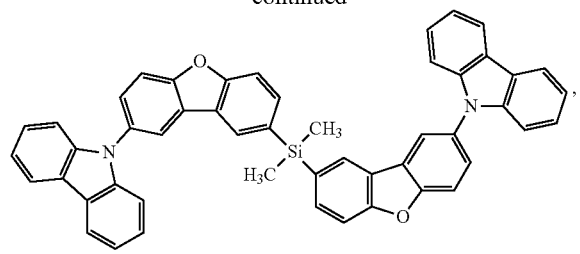

and two carbene complexes, preferably of formula

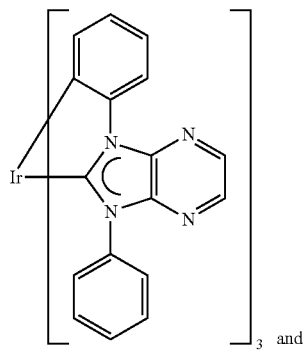

and

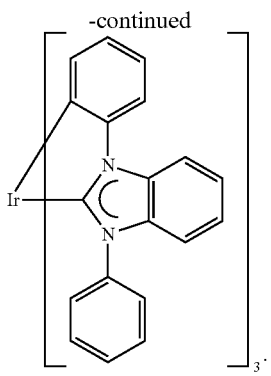

In said embodiment, the light-emitting layer is formed from 2 to 40% by weight, preferably 5 to 35% by weight, of

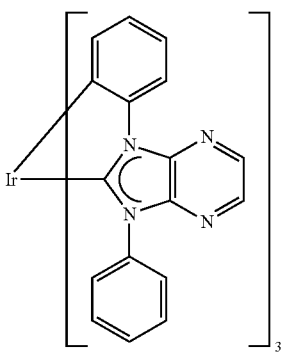

and 60 to 98% by weight, preferably 65 to 95% by weight, of at least one of the aforementioned matrix materials—in one embodiment a compound of the formula (V)—and

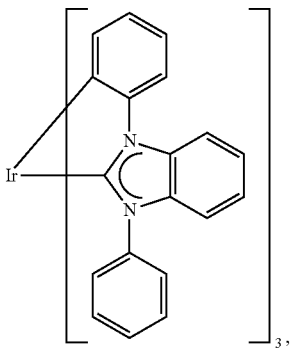

where the sum total of the carbene complexes and of at least one of the aforementioned matrix materials—in one embodiment the compound of formula (V)—adds up to 100% by weight.

In a preferred embodiment, the light-emitting layer comprises at least one of the aforementioned matrix materials—in one embodiment a compound of formula (V)—as described below as matrix material and one or two carbene complexes, preferably of formula (Ia) and/or (Ib).

In a further embodiment, the at least one of the aforementioned matrix materials—in one embodiment the compounds of the formula (V)—are used as hole/exciton blocker material, preferably together with carbene complexes as triplet emitters. The at least one of the aforementioned matrix materials—in one embodiment the compounds of the formula (V)—may also be used both as matrix materials and as hole/exciton blocker materials together with carbene complexes as triplet emitters.

If the blocking layer for holes/excitons (4) does not comprise any one of the aforementioned matrix materials—in one embodiment any compound of the formula (V)—or in addition to any one of the aforementioned matrix materials—in one embodiment any compound of the formula (V)—, the OLED has—if a blocking layer for holes is present—hole blocker materials typically used in OLEDs, such as 2,6-bis(N-carbazolyl)pyridine (mCPy), 2,9-dimethyl-4,7-diphenyl-1,10-phenanthroline (bathocuproin, (BCP)), bis(2-methyl-8-quinolinato)-4-phenylphenylato)aluminum(III) (BAlq), phenothiazine S,S-dioxide derivates and 1,3,5-tris(N-phenyl-2-benzylimidazolyl)benzene) (TPBI), TPBI also being suitable as electron-conducting material. Further suitable hole blockers and/or electron transport materials are 2,2′,2″-(1,3,5-benzenetriyl)tris(1-phenyl-1-H-benzimidazole), 2-(4-biphenylyl)-5-(4-tert-butylphenyl)-1,3,4-oxadiazole, 8-hydroxyquinolinolatolithium, 4-(naphthalen-1-yl)-3,5-diphenyl-4H-1,2,4-triazole, 1,3-bis[2-(2,2′-bipyridin-6-yl)-1,3,4-oxadiazol-5-yl]benzene, 4,7-diphenyl-1,10-phenanthroline, 3-(4-biphenylyl)-4-phenyl-5-tert-butylphenyl-1,2,4-triazole, 6,6′-bis[5-(biphenyl-4-yl)-1,3,4-oxadiazo-2-yl]-2,2′-bipyridyl, 2-phenyl-9,10-di(naphthalene-2-yl)anthracene, 2,7-bis[2-(2,2′-bipyridin-6-yl)-1,3,4-oxadiazo-5-yl]-9,9-dimethylfluorene, 1,3-bis[2-(4-tert-butylphenyl)-1,3,4-oxadiazo-5-yl]benzene, 2-(naphthalene-2-yl)-4,7-diphenyl-1,10-phenanthroline, tris(2,4,6-trimethyl-3-(pyridin-3-yl)phenyl)borane, 2,9-bis(naphthalene-2-yl)-4,7-diphenyl-1,10-phenanthroline, 1-methyl-2-(4-(naphthalene-2-yl)phenyl)-1H-imidazo[4,5-f][1,10]phenanthroline. In a further embodiment, it is possible to use compounds which comprise aromatic or heteroaromatic rings joined via groups comprising carbonyl groups, as disclosed in WO2006/100298, disilyl compounds selected from the group consisting of disilylcarbazoles, disilylbenzofurans, disilylbenzothiophenes, disilylbenzophospholes, disilylbenzothiophene S-oxides and disilylbenzothiophene S,S-dioxides, as specified, for example, in WO2009003919 (PCT/EP2008/058207) and WO2009003898 (PCT/EP2008/058106) and disilyl compounds as disclosed in WO2008/034758, as a blocking layer for holes/excitons (4) or as matrix materials in the light-emitting layer (3).

In a preferred embodiment, the present invention relates to an inventive OLED comprising the layers (1) anode, (2) hole transport layer, (3) light-emitting layer, (4) blocking layer for holes/excitons, (5) electron transport layer and (6) cathode, and if appropriate further layers, wherein the hole transport layer comprises at least one metal organic compound and at least one metal oxide. Suitable metal organic compounds and metal oxides as well as suitable amounts are mentioned before.

Suitable electron transport materials for the layer (5) of the inventive OLEDs comprise metals chelated to oxinoid compounds, such as 2,2′,2″-(1,3,5-phenylene)tris[1-phenyl-1H-benzimidazole] (TPBI), tris(8-quinolinolato)aluminum ($Alq_3$), compounds based on phenanthroline, such as 2,9-dimethyl-4,7-diphenyl-1,10-phenanthroline (DDPA=BCP) or 4,7-diphenyl-1,10-phenanthroline (DPA), and azole compounds such as 2-(4-biphenylyl)-5-(4-t-butylphenyl)-1,3,4-oxadiazole (PBD) and 3-(4-biphenylyl)-4-phenyl-5-(4-t-butylphenyl)-1,2,4-triazole (TAZ),8-hydroxyquinolinolatolithium (Liq), 4,7-diphenyl-1,10- phenanthroline (BPhen), bis(2-methyl-8-quinolinolato)-4-(phenylphenolato)-aluminum (BAlq), 1,3-bis[2-(2,2'-bipyridin-6-yl)-1,3,4-oxadiazo-5-yl]benzene (Bpy-OXD), 6,6'-bis[5-(biphenyl-4-yl)-1,3,4-oxadiazo-2-yl]-2,2'-bipyridyl (BP-OXD-Bpy), 4-(naphthalen-1-yl)-3,5-diphenyl-4H-1,2,4-triazole (NTAZ),2,9-bis(naphthalen-2-yl)-4,7-diphenyl-1,10-phenanthroline (NBphen), 2,7-bis[2-(2,2'-bipyridin-6-yl)-1,3,4-oxadiazo-5-yl]-9,9-dimethylfluorene (Bby-FOXD), 1,3-bis[2-(4-tert-butylphenyl)-1,3,4-oxadiazo-5-yl]benzene (OXD-7), tris(2,4,6-trimethyl-3-(pyridin-3-yl)phenyl)borane (3TPYMB), 1-methyl-2-(4-(naphthalen-2-yl)phenyl)-1H-imidazo[4,5-f][1,10]phenanthroline (2-NPIP), 2-phenyl-9,10-di(naphthalen-2-yl)anthracene (PADN), 2-(naphthalen-2-yl)-4,7-diphenyl-1,10-phenanthroline (HNBphen). The layer (5) may serve both to facilitate electron transport and as a buffer layer or barrier layer in order to prevent quenching of the exciton at the interfaces of the layers of the OLED. The layer (5) preferably improves the mobility of the electrons and reduces quenching of the exciton. In a preferred embodiment, TPBI is used as the electron conductor material. In principle, it is possible that the electron conductor layer comprises at least one compound of the formula (V) as electron conductor material.

In a preferred embodiment, the electron transport layer (5) of the inventive OLEDs comprises an organic metal complex of formula (II) and preferably additionally a compound of formula (III), (IVa) or (IVb). The layer (5) preferably improves the mobility of the electrons. The compounds of formulae (II), (III), (IVa) and (IVb) as well as suitable amounts of said compounds in an organic layer, especially in an electron transport layer, are mentioned above.

Among the materials mentioned above as hole transport materials and electron transport materials, some may fulfil several functions. For example, some of the electron-transporting materials are simultaneously hole-blocking materials when they have a low-lying HOMO. These can be used, for example, in the blocking layer for holes/excitons (4).

The charge transport layers can also be electronically doped in order to improve the transport properties of the materials used, in order firstly to make the layer thicknesses more generous (avoidance of pinholes/short circuits) and in order secondly to minimize the operating voltage of the device. For example, the hole transport materials can be doped with electron acceptors; for example, phthalocyanines or arylamines such as TPD or TDTA can be doped with tetrafluorotetracyanquinodimethane (F4-TCNQ) or with $MoO_3$ or $WO_3$. Electronic doping is known to those skilled in the art and is disclosed, for example, in W. Gao, A. Kahn, J. Appl. Phys., Vol. 94, No. 1, 1 Jul. 2003 (p-doped organic layers); A. G. Werner, F. Li, K. Harada, M. Pfeiffer, T. Fritz, K. Leo. Appl. Phys. Lett., Vol. 82, No. 25, 23 Jun. 2003 and Pfeiffer et al., Organic Electronics 2003, 4, 89-103.

The cathode (6) is an electrode which serves to introduce electrons or negative charge carriers. Suitable materials for the cathode are selected from the group consisting of alkali metals of group Ia, for example Li, Cs, alkaline earth metals of group IIa, for example calcium, barium or magnesium, metals of group IIb of the periodic table of the elements (old IUPAC version), comprising the lanthanides and actinides, for example samarium. In addition, it is also possible to use metals such as aluminum or indium, and combinations of all metals mentioned. In addition, lithium-comprising organometallic compounds or potassium fluoride (KF) can be applied between the organic layer and the cathode in order to reduce the operating voltage.

The OLED according to the present invention may additionally comprise further layers which are known to those skilled in the art. For example, a layer which facilitates the transport of the positive charge and/or matches the band gaps of the layers to one another may be applied between the layer (2) and the light-emitting layer (3). Alternatively, this further layer may serve as a protective layer. In an analogous manner, additional layers may be present between the light-emitting layer (3) and the layer (4) in order to facilitate the transport of negative charge and/or to match the band gaps between the layers to one another. Alternatively, this layer may serve as a protective layer.

In a preferred embodiment, the inventive OLED, in addition to layers (1) to (6), comprises at least one of the following layers mentioned below:

a hole injection layer between the anode (1) and the hole-transport layer (2);

a blocking layer for electrons between the hole-transport layer (2) and the light-emitting layer (3);

an electron injection layer between the electron-transport layer (5) and the cathode (6).

Materials for a hole injection layer may be selected from copper phthalocyanine, 4,4',4"-tris(N-3-methylphenyl-N-phenylamino)triphenylamine (m-MTDATA), 4,4',4"-tris-(N-(2-naphthyl)-N-phenylamino)triphenylamine (2T-NATA), 4,4',4"-tris(N-(1-naphthyl)-N-phenylamino)triphenylamine (1T-NATA), 4,4',4"-tris(N,N-diphenylamino)triphenylamine (NATA), titanium oxide phthalocyanine, 2,3,5,6-tetrafluoro-7,7,8,8-tetracyanoquinodimethane (F4-TCNQ), pyrazino[2,3-f][1,10]phenanthroline-2,3-dicarbonitrile (PPDN), N,N,N',N'-tetrakis(4-methoxyphenyl)benzidine (MeO-TPD), 2,7-bis[N,N-bis(4-methoxyphenyl)amino]-9,9-spirobifluorene (MeO-Spiro-TPD), 2,2'-bis[N,N-bis(4-methoxyphenyl)amino]-9,9-spirobifluorene (2,2'-MeO-Spiro-TPD), N,N'-diphenyl-N,N'-di-[4-(N,N-ditolylamino)phenyl]benzidine (NTNPB), N,N'-diphenyl-N,N'-di-[4-(N,N-diphenyl-amino)phenyl]benzidine (NPNPB), N,N'-di(naphthalen-2-yl)-N,N'-diphenylbenzene-1,4-diamine (α-NPP). In principle, it is possible that the hole injection layer comprises at least one metal organic compound and at least one metal oxide. Suitable metal organic compounds and suitable metal oxides as well as suitable amounts of said metal organic compounds and said metal oxides are mentioned before.

As a material for the electron injection layer, KF, or Liq, for example, can be selected. KF is more preferred than Liq.

The person skilled in the art is aware (for example on the basis of electrochemical studies) of how suitable materials have to be selected. Suitable materials for the individual layers are known to those skilled in the art and are disclosed, for example, in WO 00/70655.

In addition, it is possible that some of the layers used in the inventive OLED have been surface-treated in order to increase the efficiency of charge carrier transport. The selection of the materials for each of the layers mentioned is preferably determined by obtaining an OLED with a high efficiency and lifetime.

The inventive OLED can be produced by methods known to those skilled in the art. In general, the inventive OLED is produced by successive vapor deposition of the individual layers onto a suitable substrate. Suitable substrates are, for example, glass, inorganic semitransports, typically ITO, or IZO, or polymer films. For vapor deposition, it is possible to use customary techniques, such as thermal evaporation, chemical vapor deposition (CVD), physical vapor deposition (PVD) and others. In an alternative process, the organic layers of the OLED can be applied from solutions or dispersions in suitable solvents, employing coating techniques known to those skilled in the art.

In general, the different layers have the following thicknesses: anode (1) 50 to 500 nm, preferably 100 to 200 nm; hole-conducting layer (2) 5 to 100 nm, preferably 20 to 80 nm, light-emitting layer (3) 1 to 100 nm, preferably 10 to 80 nm, blocking layer for holes/excitons (4) 2 to 100 nm, preferably 5 to 50 nm, electron-conducting layer (5) 5 to 100 nm, preferably 20 to 80 nm, cathode (6) 20 to 1000 nm, preferably 30 to 500 nm. The relative position of the recombination zone of holes and electrons in the inventive OLED in relation to the cathode and hence the emission spectrum of the OLED can be influenced, among other factors, by the relative thickness of each layer. This means that the thickness of the electron transport layer should preferably be selected such that the position of the recombination zone is matched to the optical resonator property of the diode and hence to the emission wavelength of the emitter. The ratio of the layer thicknesses of the individual layers in the OLED depends on the materials used. The layer thicknesses of any additional layers used are known to those skilled in the art. It is possible that the electron-conducting layer and/or the hole-conducting layer have greater thicknesses than the layer thicknesses specified when they are electrically doped.

Use of the first organic layer, especially the hole transport layer or hole injection layer, of the present application makes it possible to obtain OLEDs with high efficiency and with low operating voltage. Frequently, the OLEDs obtained by the use of the first organic layer, especially the hole transport layer or hole injection layer, of the present application additionally have high lifetimes. The efficiency of the OLEDs can additionally be improved by optimizing the other layers of the OLEDs. Shaped substrates and novel electron-transport materials which bring about a reduction in the operating voltage or an increase in the quantum efficiency are likewise usable in the inventive OLEDs. Moreover, additional layers may be present in the OLEDs in order to adjust the energy level of the different layers and to facilitate electroluminescence.

The OLEDs may further comprise at least one second light-emitting layer. The overall emission of the OLEDs may be composed of the emission of the at least two light-emitting layers and may also comprise white light.

The OLEDs can be used in all apparatus in which electroluminescence is useful. Suitable devices are preferably selected from stationary and mobile visual display units and illumination units. Stationary visual display units are, for example, visual display units of computers, televisions, visual display units in printers, kitchen appliances and advertising panels, illuminations and information panels. Mobile visual display units are, for example, visual display units in cellphones, laptops, digital cameras, MP3 players, vehicles and destination displays on buses and trains. Further devices in which the inventive OLEDs can be used are, for example, keyboards; items of clothing; furniture; wallpaper.

In addition, the electron transport layer of the present application can be used in OLEDs with inverse structure. The structure of inverse OLEDs and the materials typically used therein are known to those skilled in the art.

In addition, the present invention relates to an apparatus selected from the group consisting of stationary visual display units such as visual display units of computers, televisions, visual display units in printers, kitchen appliances and advertising panels, illuminations, information panels, and mobile visual display units such as visual display units in cellphones, laptops, digital cameras, MP3 players, vehicles and destination displays on buses and trains; illumination units; keyboards; items of clothing; furniture; wallpaper, comprising the inventive organic electronic device, or the inventive organic layer, especially electron transport layer.

The following examples are included for illustrative purposes only and do not limit the scope of the claims. Unless otherwise stated, all parts and percentages are by weight.

EXAMPLES

I Conductivity

Comparative Conductivity Example 1

The ITO substrate used as the anode is first cleaned with commercial detergents for LCD production (Deconex® 20NS, and 250RGAN-ACID® neutralizing agent) and then in an acetone/isopropanol mixture in an ultrasound bath. To eliminate any possible organic residues, the substrate is exposed to a continuous ozone flow in an ozone oven for a further 25 minutes. This treatment also improves the hole injection properties of the ITO.

Thereafter, the organic materials specified below are applied by vapor deposition to the clean substrate at a rate of approx. 0.5-5 nm/min at about $10^{-8}$ mbar. Ir(dpbic)$_3$ (V1) is applied to the substrate with a thickness of 80 nm.

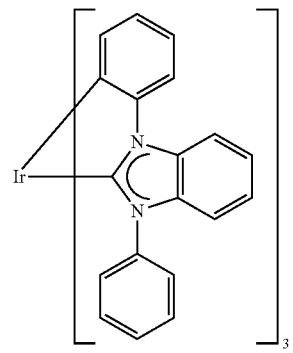

V-1

Ir(dpbic)$_3$ (for preparation, see Ir complex (7) in the application WO 2005/019373).

Finally, a 100 nm-thick Al electrode is applied by vapor deposition.

Conductivity Example 1

Production and construction of the device as in the comparative conduction example 1, except Ir(dpbic)$_3$ (V1) doped with 5% by weight of MoO$_3$ is applied to the substrate instead of Ir(dpbic)$_3$ (V1) alone.

Conductivity Example 2

Production and construction of the device as in the comparative conduction example 1, except Ir(dpbic)$_3$ (V1) doped with 5% by weight of ReO$_3$ is applied to the substrate instead of Ir(dpbic)$_3$ (V1) alone.

A @ 2V, mA/cm2 @ 2V, Electrical resistivity Ω·cm and Conductivity S/m, measured for the devices of the Conductivity Examples and Comparative Conductivity Example are shown in Table 1 below.

| Device | Layer | A @ 2 V | mA/cm2 @ 2 V | Electrical resistivity Ω·cm | Conductivity S/m |
|---|---|---|---|---|---|
| Comp. Cond Ex. 1 | V1[1)] | 2.84E−5 | 7.10E−1 | 3.52E+8 | 2.84E−7 |
| Cond. Ex. 1 | V1 (95 wt %) + MoO$_3$ (5 wt %) | 0.00491 | 1.23E+2 | 2.04E+6 | 4.91E−5 |
| Cond. Ex. 2 | V1 (95 wt %) + ReO$_3$ (5 wt %) | 0.17025 | 4.26E+3 | 5.87E+4 | 1.70E−3 |

[1)]Ir(dpbic)$_3$

The conductivity of V1 doped with a metal oxide, especially doped with ReO$_3$, is much higher than the conductivity of V1 alone.

II Application Examples

Comparative Application Example 1

The ITO substrate used as the anode is first cleaned with commercial detergents for LCD production (Deconex® 20NS, and 250RGAN-ACID® neutralizing agent) and then in an acetone/isopropanol mixture in an ultrasound bath. To eliminate any possible organic residues, the substrate is exposed to a continuous ozone flow in an ozone oven for a further 25 minutes. This treatment also improves the hole injection properties of the ITO. Then AJ20-1000 (commercially available from Plexcore) is spin-coated and dried to form an hole injection layer (~40 nm).

Thereafter, the organic materials specified below are applied by vapor deposition to the clean substrate at a rate of approx. 0.5-5 nm/min at about $10^{-8}$ mbar. As a hole transport and exciton blocker, Ir(dpbic)$_3$ (V1) is applied to the substrate with a thickness of 40 nm.

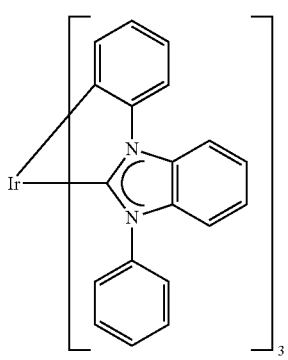

(V-1)

Ir(dpbic)$_3$ (for preparation, see Ir complex (7) in the application WO 2005/019373).

Subsequently, a mixture of 30% by weight of compound

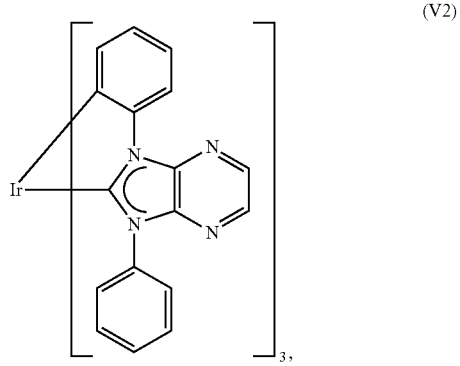

(V2)

35% by weight of compound (V1) and 35% by weight of compound

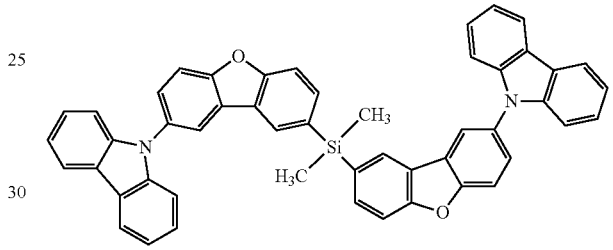

(V3, described in PCT/EP2009/067120) is applied by vapor deposition in a thickness of 40 nm, compound V2 functioning as an emitter material, compounds V1 and V3 as a matrix material.

Subsequently, the material

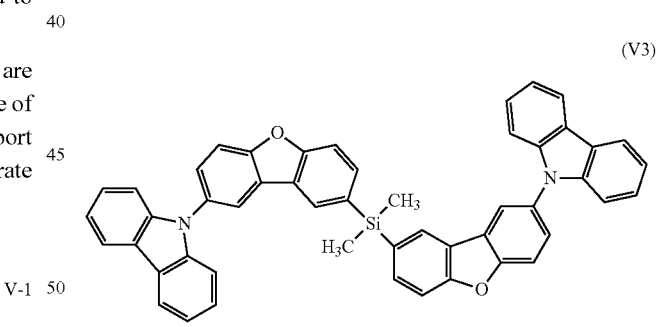

(V3)

is applied by vapor deposition with a thickness of 5 nm as exciton and hole blocker.

Next, a mixture of 25% by weight of

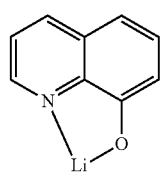

(8-hydroxyquinolinolato-lithium (Liq)) and 75% by weight of

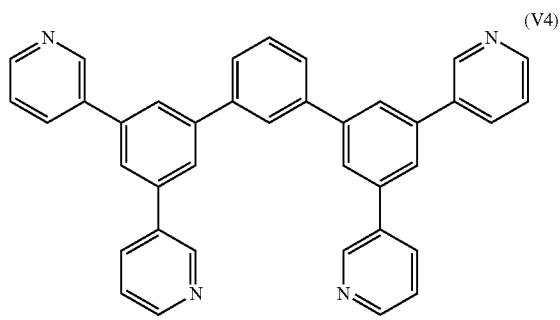 [SMILES: c1cncc(-c2cc(-c3cccnc3)cc(-c3cccc(-c4cc(-c5cccnc5)cc(-c5cccnc5)c4)c3)c2)c1]

(V4)

first 35 nm are doped with ReO$_3$ (5% by weight) to form a hole transport and exciton blocker.

To characterize the OLED, electroluminescence spectra are recorded at various currents and voltages. In addition, the current-voltage characteristic is measured in combination with the light output emitted. The light output can be converted to photometric parameters by calibration with a photometer. To determine the lifetime, the OLED is operated at a constant current density and the decrease in the light output is recorded. The lifetime is defined as that time which lapses until the luminance decreases to half of the initial luminance.

V @ 300 cd/m$^2$, lm/W @ 300 cd/m$^2$, EQE (%) @ 300 cd/m$^2$, lifetime (h) @ 2000 cd/m$^2$, lifetime (h) @ 300 cd/m$^2$ and Color (CIE), measured for the devices of the Application Examples and Comparative Application Example are shown in Table 2 below, wherein the measured data of the Comparative Application Example is set to 100 and the data of the Application Examples are specified in relation to those of the Comparative Application Example.

TABLE 2

| Device | HT Layer | Color | V @ 300 cd/m$^2$ | lm/W @ 300 cd/m$^2$ | EQE[2] (%) @ 300 cd/m$^2$ | Lifetime (h) @ 2000 cd/m$^2$ | Lifetime (h) @ 300 cd/m$^2$ |
|---|---|---|---|---|---|---|---|
| Comp. Appl. Ex. 1 | V1[1] | X = 0.174 Y = 0.307 | 100 | 100 | 100 | 100 | 100 |
| Appl. Ex. 1 | V1 (50 wt %) + MoO$_3$ (50 wt %) | X = 0.175 Y = 0.311 | 89 | 105 | 94 | 175 | 175 |
| Appl. Ex. 2 | V1 (50 wt %) + ReO$_3$ (50 wt %) | X = 0.184 Y = 0.344 | 101 | 107 | 107 | 166 | 164 |
| Appl. Ex. 3 | V1 (97 wt %) + ReO$_3$ (3 wt %) | X = 0.184 Y = 0.344 | 97 | 124 | 112 | 267 | 267 |
| Appl. Ex. 4 | V1 (95 wt %) + MoO$_3$ (5 wt %) | X = 0.184 Y = 0.344 | 97 | 161 | 144 | 303 | 297 |

[1]Ir(dpbic)$_3$
[2]External quantum efficiency (EQE) is # of generated photons escaped from a substance or a device/# of electrons flowing through it.
HT Layer = Hole Transport Layer.

is applied as electron transport layer by vapor deposition in a thickness of 40 nm, as are a 2 nm-thick potassium fluoride layer (electron injection layer) and finally a 100 nm-thick Al electrode.

Application Example 1

Production and construction of an OLED as in the comparative application example 1, except Ir(dpbic)$_3$ (V1) is applied to the substrate with a thickness of 40 nm, wherein the first 35 nm are doped with MoO$_3$ (50% by weight) to form a hole transport and exciton blocker.

Application Example 2

Production and construction of an OLED as in the comparative application example 1, except Ir(dpbic)$_3$ (V1) is applied to the substrate with a thickness of 40 nm, wherein the first 35 nm are doped with ReO$_3$ (50% by weight) to form a hole transport and exciton blocker.

Application Example 3

Production and construction of an OLED as in the comparative application example 1, except Ir(dpbic)$_3$ (V1) is applied to the substrate with a thickness of 40 nm, wherein the first 35 nm are doped with ReO$_3$ (3% by weight) to form a hole transport and exciton blocker.

Application Example 4

Production and construction of an OLED as in the comparative application example 1, except Ir(dpbic)$_3$ (V1) is applied to the substrate with a thickness of 40 nm, wherein the The life time, power efficiency and quantum efficiency of the devices of the Application Examples are superior as compared with the devices of the Comparative Application Example.

The invention claimed is:
1. An organic electronic device including a first electrode, a second electrode, and a first organic layer interposed between the first electrode and the second electrode, wherein the first organic layer comprises at least one metal organic compound and at least one metal oxide, wherein the at least one metal oxide comprises ReO$_3$ wherein the metal organic compound is a metal carbene complex of formula (I)

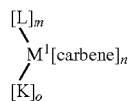

wherein the symbols have the following meanings:
$M^1$ is a metal atom selected from the group consisting of Rh, Ir, Pd, Pt, Ru, and Os, in any oxidation state possible for the respective metal atom;
carbene is a carbene ligand which may be uncharged or monoanionic and
monodentate, bidentate or tridentate, with the carbene ligand also being able to be a biscarbene or triscarbene ligand;
L is a monoanionic or dianionic ligand, which may be monodentate or bidentate;

K is an uncharged monodentate or bidentate ligand selected from the group consisting of phosphines; phosphonates and derivatives thereof, arsenates and derivatives thereof;

phosphites; CO; pyridines; nitriles and conjugated dienes which form a π complex with $M^1$;

n is the number of carbene ligands, where n is at least 1 and when n>1 the carbene ligands in the complex of the formula I can be identical or different;

m is the number of ligands L, where m can be 0 or ≥1 and when m>1 the ligands L can be identical or different;

o is the number of ligands K, where o can be 0 or ≥1 and when o>1 the ligands K can be identical or different;

where the sum n+m+o is dependent on the oxidation state and coordination number of the metal atom and on the denticity of the ligands carbene, L and K and also on the charge on the ligands, carbene and L, with the proviso that n is at least 1.

2. An organic electronic device according to claim 1, wherein the metal oxide is employed in the first organic layer in an amount of from 0.1 to <10% by weight, based on the total weight of the first organic layer.

3. An organic electronic device according to claim 1, wherein the metal carbene complex has the following formula

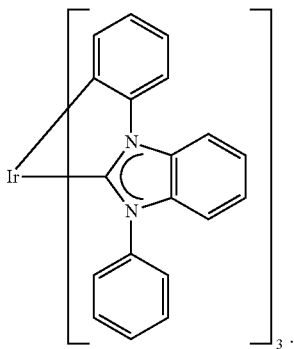

4. An organic electronic device according to claim 1, wherein the first organic layer comprising at least one metal organic compound and at least one metal oxide is a hole transport layer or a hole injection layer.

5. An organic electronic device according to claim 1 additionally comprising a second organic layer comprising at least one compound of formula (II)

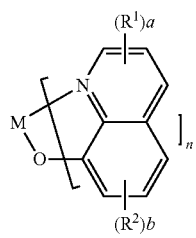

wherein $R^1$ and $R^2$ are independently of each other F, $C_1$-$C_8$alkyl, or $C_6$-$C_{14}$aryl, which may optionally be substituted by one, or more $C_1$-$C_8$alkyl groups, or two substituents $R^1$ and/or $R^2$ combine to form a fused benzene ring group, which may optionally be substituted by one, or more $C_1$-$C_8$alkyl groups, a and b are independently of each other 0, or an integer 1 to 3, M is an alkali metal atom, or an earth alkaline metal atom, n is 1, if M is an alkali metal atom, n is 2, if M is an earth alkaline metal atom.

6. An organic electronic device according to claim 5, wherein the second organic layer additionally comprises at least one compound of formula (III), (IVa) and/or (IVb)

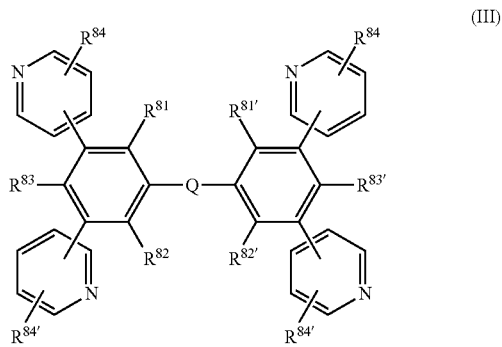

wherein $R^{81}$, $R^{82}$, $R^{83}$, $R^{84}$, $R^{81'}$, $R^{82'}$, $R^{83'}$, and $R^{84'}$ are independently of each other H, $C_1$-$C_{18}$alkyl, $C_1$-$C_{18}$alkyl which is substituted by E and/or interrupted by D, $C_6$-$C_{24}$aryl, $C_6$-$C_{24}$aryl which is substituted by G, $C_2$-$C_{20}$heteroaryl, or $C_2$-$C_{20}$heteroaryl which is substituted by G, Q is an arylene or heteroarylene group, each of which may optionally be substituted by G;

D is —CO—; —COO—; —S—; —SO—; —$SO_2$—; —O—; —$NR^{25}$—; —$SiR^{30}R^{31}$—; —$POR^{32}$—; —$CR^{23}$=$CR^{24}$—; or —C≡C—; and E is —$OR^{29}$; —$SR^{29}$; —$NR^{25}R^{26}$; —$COR^{28}$; —$COOR^{27}$; —$CONR^{25}R^{26}$; —CN; or F; G is E, $C_1$-$C_{18}$alkyl, $C_1$-$C_{18}$alkyl which is interrupted by D, $C_1$-$C_{18}$perfluoroalkyl, $C_1$-$C_{18}$alkoxy, or $C_1$-$C_{18}$alkoxy which is substituted by E and/or interrupted by D, wherein $R^{23}$ and $R^{24}$ are independently of each other H, $C_6$-$C_{18}$aryl; $C_6$-$C_{18}$aryl which is substituted by $C_1$-$C_{18}$alkyl, or $C_1$-$C_{18}$alkoxy; $C_1$-$C_{18}$alkyl; or $C_1$-$C_{18}$alkyl which is interrupted by —O—;

$R^{25}$ and $R^{26}$ are independently of each other $C_6$-$C_{18}$aryl; $C_6$-$C_{18}$aryl which is substituted by $C_1$-$C_{18}$alkyl, or $C_1$-$C_{18}$alkoxy; $C_1$-$C_{18}$alkyl; or $C_1$-$C_{18}$alkyl which is interrupted by —O—; or $R^{25}$ and $R^{26}$ together form a five or six membered ring, $R^{27}$ and $R^{28}$ are independently of each other $C_6$-$C_{18}$aryl; $C_6$-$C_{18}$aryl which is substituted by $C_1$-$C_{18}$alkyl, or $C_1$-$C_{18}$alkoxy; $C_1$-$C_{18}$alkyl; or $C_1$-$C_{18}$alkyl which is interrupted by —O—, $R^{29}$ is $C_6$-$C_{18}$aryl; $C_6$-$C_{18}$aryl, which is substituted by $C_1$-$C_{18}$alkyl, or $C_1$-$C_{18}$alkoxy; $C_1$-$C_{18}$alkyl; or $C_1$-$C_{18}$alkyl which is interrupted by —O—, $R^{30}$ and $R^{31}$ are independently of each other $C_1$-$C_{18}$alkyl, $C_6$-$C_{18}$aryl, or $C_6$-$C_{18}$aryl, which is substituted by $C_1$-$C_{18}$alkyl, $R^{32}$ is $C_1$-$C_{18}$alkyl, $C_6$-$C_{18}$aryl, or $C_6$-$C_{18}$aryl, which is substituted by $C_1$-$C_{18}$alkyl;

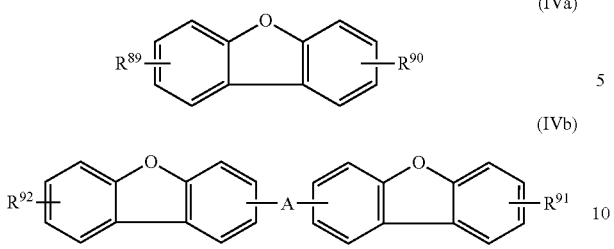

wherein
- R⁸⁹ is phenanthryl, pyrenyl, triphenylenyl, 1,10-phenanthrolinyl, triazinyl, dibenzothiophenyl, or pyrimidinyl, each of which may optionally be substituted by one, or more $C_1$-$C_{18}$alkyl, $C_6$-$C_{14}$aryl, or $C_2$-$C_{20}$heteroaryl groups,
- R⁹⁰ is phenanthryl, pyrenyl, triphenylenyl, 1,10-phenanthrolinyl, triazinyl, dibenzothiophenyl, or pyrimidinyl, each of which may optionally be substituted by one, or more $C_1$-$C_{18}$alkyl, $C_6$-$C_{14}$aryl, or $C_2$-$C_{20}$heteroaryl groups,
- R⁹¹ is phenanthryl, pyrenyl, triphenylenyl, 1,10-phenanthrolinyl, triazinyl, dibenzothiophenyl, pyrimidinyl, or dibenzofuranyl, each of which may optionally be substituted by one, or more $C_1$-$C_{18}$alkyl, $C_6$-$C_{14}$aryl, or $C_2$-$C_{20}$heteroaryl groups,
- R⁹² is H, phenanthryl, pyrenyl, triphenylenyl, 1,10-phenanthrolinyl, triazinyl, dibenzothiophenyl, or pyrimidinyl, each of which may optionally be substituted by one, or more $C_1$-$C_{18}$alkyl, $C_6$-$C_{14}$aryl, or $C_2$-$C_{20}$heteroaryl groups,
- A is a single bond, arylene, or heteroarylene group, each of which may optionally be substituted by one, or more $C_1$-$C_{18}$alkyl groups; or —SiR⁸⁷R⁸⁸—, wherein R⁸⁷ and R⁸⁸ are independently of each other $C_1$-$C_{18}$alkyl, or $C_6$-$C_{14}$aryl groups, which may optionally be substituted by one, or more $C_1$-$C_{18}$alkyl groups.

7. An organic electronic device according to claim 1, wherein the organic electronic device is selected from the group consisting of an organic solar cell, a switching element and an organic light-emitting diode.

8. An organic electronic device according to claim 7, wherein the organic electronic device is an OLED additionally comprising a light emitting layer comprising at least one phosphorescent light emitting material.

9. An organic electronic device according to claim 8, wherein the light emitting layer additionally comprises at least one compound of formula (X) as host material

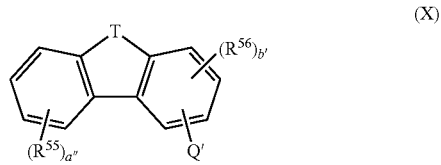

in which
- T is NR⁵⁷, S, O or PR⁵⁷;
- R⁵⁷ is aryl, heteroaryl, alkyl, cycloalkyl or heterocycloalkyl;
- Q' is —NR⁵⁸R⁵⁹, —SiR⁷⁰R⁷¹R⁷², —P(O)R⁶⁰R⁶¹, —PR⁶²R⁶³, —S(O)₂R⁶⁴, —S(O)R⁶⁵, —SR⁶⁶ or —OR⁶⁷;
- R⁵⁵, R⁵⁶ are each independently alkyl, cycloalkyl, heterocycloalkyl, aryl, heteroaryl, SiR⁷⁰R⁷¹R⁷², a Q' group or a group with donor or acceptor action;
- a" is 0, 1, 2, 3 or 4;
- b' is 0, 1, 2 or 3;
- R⁵⁸, R⁵⁹ form, together with the nitrogen atom, a cyclic radical which has 3 to ring atoms and may be unsubstituted or substituted by one or more substituents selected from alkyl, cycloalkyl, heterocycloalkyl, aryl, heteroaryl and a group with donor or acceptor action, and/or may be fused to one or more further cyclic radicals having 3 to 10 ring atoms, where the fused radicals may be unsubstituted or substituted by one or more substituents selected from alkyl, cycloalkyl, heterocycloalkyl, aryl, heteroaryl and a group with donor or acceptor action;
- R⁷⁰, R⁷¹, R⁷², R⁶⁰, R⁶¹, R⁶², R⁶³, R⁶⁴, R⁶⁵, R⁶⁶, R⁶⁷ are each independently aryl, heteroaryl, alkyl, cycloalkyl or heterocycloalkyl, or two units of the general formula (X) are bridged to one another via a linear or branched, saturated or unsaturated bridge optionally interrupted by at least one heteroatom, via a bond or via O.

10. An organic electronic device according to claim 8, wherein the light emitting layer additionally comprises at least one compound of formula (V) as host material

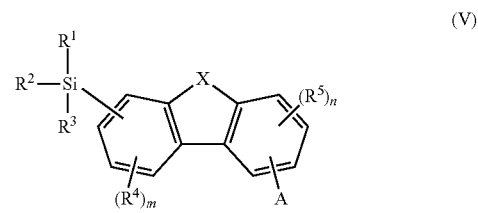

wherein
- X is NR, S, O or PR;
- R is aryl, heteroaryl, alkyl, cycloalkyl, or heterocycloalkyl;
- A is —NR⁶R⁷, —P(O)R⁸R⁹, —PR¹⁰R¹¹, —S(O)₂R¹², —S(O)R¹³, —SR¹⁴, or —OR¹⁵;
- R¹, R² and R³ are independently of each other aryl, heteroaryl, alkyl, cycloalkyl, or heterocycloalkyl, wherein at least on of the groups R¹, R², or R³ is aryl, or heteroaryl;
- R⁴ and R⁵ are independently of each other alkyl, cycloalkyl, heterocycloalkyl, aryl, heteroaryl, a group A, or a group having donor, or acceptor characteristics;
- n and m are independently of each other 0, 1, 2, or 3;
- R⁶, R⁷ form together with the nitrogen atom a cyclic residue having 3 to 10 ring atoms, which can be unsubstituted, or which can be substituted with one, or more substituents selected from alkyl, cycloalkyl, heterocycloalkyl, aryl, heteroaryl and a group having donor, or acceptor characteristics; and/or which can be annulated with one, or more further cyclic residues having 3 to 10 ring atoms, wherein the annulated residues can be unsubstituted, or can be substituted with one, or more substituents selected from alkyl, cycloalkyl, heterocycloalkyl, aryl, heteroaryl and a group having donor, or acceptor characteristics; and
- R⁸, R⁹, R¹⁰, R¹¹, R¹², R¹³, R¹⁴ and R¹⁵ are independently of each other aryl, heteroaryl, alkyl, cycloalkyl, or heterocycloalkyl.

11. An apparatus comprising the organic electronic device according to claim 1.

12. A hole transport layer or a hole injection layer comprising at least one metal organic compound and at least one metal oxide, wherein the at least one metal oxide comprises ReO$_3$ wherein the metal organic compound is a metal carbene complex of formula (I)

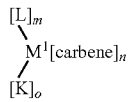

wherein the symbols have the following meanings:
M$^1$ is a metal atom selected from the group consisting of Rh, Ir, Pd, Pt, Ru, and Os, in any oxidation state possible for the respective metal atom;
carbene is a carbene ligand which may be uncharged or monoanionic and
monodentate, bidentate or tridentate, with the carbene ligand also being able to be a biscarbene or triscarbene ligand;
L is a monoanionic or dianionic ligand, which may be monodentate or bidentate;
K is an uncharged monodentate or bidentate ligand selected from the group consisting of phosphines; phosphonates and derivatives thereof, arsenates and derivatives thereof;
phosphites; CO; pyridines; nitriles and conjugated dienes which form a π complex with M$^1$;
n is the number of carbene ligands, where n is at least 1 and when n>1 the carbene ligands in the complex of the formula I can be identical or different;
m is the number of ligands L, where m can be 0 or ≥1 and when m>1 the ligands L can be identical or different;
o is the number of ligands K, where o can be 0 or ≥1 and when o>1 the ligands K can be identical or different;
where the sum n+m+o is dependent on the oxidation state and coordination number of the metal atom and on the denticity of the ligands carbene, L and K and also on the charge on the ligands, carbene and L, with the proviso that n is at least 1.

13. An organic electronic device including a first electrode, a second electrode, and a first organic layer interposed between the first electrode and the second electrode, wherein the first organic layer comprises at least one metal organic compound and ReO$_3$ wherein the metal organic compound is a metal carbene complex of formula (I)

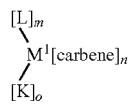

wherein the symbols have the following meanings:
M$^1$ is a metal atom selected from the group consisting of Rh, Ir, Pd, Pt, Ru, and Os, in any oxidation state possible for the respective metal atom;
carbene is a carbene ligand which may be uncharged or monoanionic and
monodentate, bidentate or tridentate, with the carbene ligand also being able to be a biscarbene or triscarbene ligand;
L is a monoanionic or dianionic ligand, which may be monodentate or bidentate;
K is an uncharged monodentate or bidentate ligand selected from the group consisting of phosphines; phosphonates and derivatives thereof, arsenates and derivatives thereof;
phosphites; CO; pyridines; nitriles and conjugated dienes which form a π complex with M$^1$;
n is the number of carbene ligands, where n is at least 1 and when n>1 the carbene ligands in the complex of the formula I can be identical or different;
m is the number of ligands L, where m can be 0 or ≥1 and when m>1 the ligands L can be identical or different;
o is the number of ligands K, where o can be 0 or ≥1 and when o>1 the ligands K can be identical or different;
where the sum n+m+o is dependent on the oxidation state and coordination number of the metal atom and on the denticity of the ligands carbene, L and K and also on the charge on the ligands, carbene and L, with the proviso that n is at least 1.

* * * * *